(12) United States Patent
Kub et al.

(10) Patent No.: US 11,649,159 B2
(45) Date of Patent: May 16, 2023

(54) SILICON CARBIDE STRUCTURE, DEVICE, AND METHOD

(71) Applicant: The Government of the United States of America, as represented by the Secretary of the Navy, Arlington, VA (US)

(72) Inventors: Francis J. Kub, Arnold, MD (US); Karl D. Hobart, Alexandria, VA (US); Eugene A. Imhoff, Washington, DC (US); Rachael L. Myers-Ward, Springfield, VA (US)

(*) Notice: Subject to any disclaimer, the term of this patent is extended or adjusted under 35 U.S.C. 154(b) by 267 days.

(21) Appl. No.: 17/020,702

(22) Filed: Sep. 14, 2020

(65) Prior Publication Data
US 2020/0407213 A1 Dec. 31, 2020

Related U.S. Application Data

(62) Division of application No. 15/908,682, filed on Feb. 28, 2018, now abandoned.

(60) Provisional application No. 62/464,814, filed on Feb. 28, 2017.

(51) Int. Cl.
*B81B 3/00* (2006.01)
*B81C 1/00* (2006.01)
*H01L 29/16* (2006.01)

(52) U.S. Cl.
CPC ......... *B81B 3/0021* (2013.01); *B81B 3/0072* (2013.01); *B81C 1/00531* (2013.01); *H01L 29/1608* (2013.01); *B81B 2201/0235* (2013.01); *B81B 2201/0242* (2013.01); *B81B 2203/0109* (2013.01); *B81B 2203/0118* (2013.01); *B81B 2203/0127* (2013.01); *B81C 2201/019* (2013.01)

(58) Field of Classification Search
CPC .................................................. H01L 21/2007
See application file for complete search history.

(56) References Cited

U.S. PATENT DOCUMENTS 6,344,663 B1 * 2/2002 Slater, Jr. ............. H01L 21/045
257/351

OTHER PUBLICATIONS

Q.-Y. Tong et al., "Fabrication of Single Crystalline SiC Layer on High Temperature Glass," J. Electrochem. Soc., vol. 144, No. 5, May 1997, pp. L111-L113. (Year: 1997).*
(Continued)

*Primary Examiner* — Peter M Albrecht
(74) *Attorney, Agent, or Firm* — US Naval Research Laboratory; Rebecca L. Forman

(57) ABSTRACT

A method of fabricating suspended beam silicon carbide microelectromechanical (MEMS) structure with low capacitance and good thermal expansion match. A suspended material structure is attached to an anchor material structure that is direct wafer bonded to a substrate. The anchor material structure and the suspended material structure are formed from either a hexagonal single-crystal SiC material, and the anchor material structure is bonded to the substrate while the suspended material structure does not have to be attached to the substrate. The substrate may be a semi-insulating or insulating SiC substrate. The substrate may have an etched recess region on the substrate first surface to facilitate the formation of the movable suspended material structures. The substrate may have patterned electrical electrodes on the substrate first surface, within recesses etched into the substrate.

8 Claims, 14 Drawing Sheets

(56) References Cited

OTHER PUBLICATIONS

A. Ellison et al., "HTCVD growth of semi-insulating 4H—SiC crystals with low defect density," Mat. Res. Soc. Symp. vol. 640 (2001), pp. H1.2.1-H1.2.11. (Year: 2001).*
P. Cong et al., "Single crystal 6H—SiC MEMS fabrication based on smart-cut technique," J. Micromech. Microeng. 15 (2005) 2243-2248. (Year: 2005).*
J. Suda et al., "Electrostatic-Actuated Suspended Ribbon Structure Fabricated in Single-Crystalline SiC by Selective Photoelectrochemical Etching," Jpn. J. Appl. Phys. 48 (2009) 111101. (Year: 2009).*
J.-H. Lee et al., "Smart-cut layer transfer of single-crystal SiC using spin-on-glass," J. Vac. Sci. Technol. B 30(4), Jul./Aug. 2012, article No. 042001. (Year: 2012).*
F. Mu et al., "Direct Wafer Bonding of SiC—SiC by SAB for Monolithic Integration of SiC MEMS and Electronics," ECS Journal of Solid State Science and Technology, 5 (9) P451-P456 (2016). (Year: 2016).*
T. Liang et al., "Fabrication of bonded SiC structure with cavity based on direct bonding process for MEMS device applications," Microsyst. Technol. (2017) 23:225-229. Published online Oct. 26, 2015. (Year: 2017).*

* cited by examiner

SILICON CARBIDE STRUCTURE, DEVICE, AND METHOD

PRIORITY CLAIM

The present application is a divisional application of U.S. application Ser. No. 15/908,682 filed on Feb. 28, 2018 by Francis J. Kub et al., entitled "SILICON CARBIDE STRUCTURE, DEVICE, AND METHOD, which claimed the benefit of U.S. Provisional Application No. 62/464,814 filed on Feb. 28, 2017 by Francis J. Kub et al., entitled "SILICON CARBIDE STRUCTURE, DEVICE, AND METHOD," the entire contents of both are incorporated herein by reference.

BACKGROUND OF THE INVENTION

Field of the Invention

The present invention relates to a structure and method of fabricating thick beam silicon carbide MEMS structure with low capacitance and good thermal expansion match.

Description of the Prior Art

3C-SiC is often used for microelectromechanical (MEMS) device structures. 3C-SiC material layers grown on silicon substrate typically have high residual stress, high dislocation density, and high surface roughness. The 3C-SiC material layers grown on a silicon substrate can be grown on silicon substrates with an (100) orientation surface or an (111) orientation surface. There is significant thermal expansion mismatch between the 3C-SiC epitaxial layer and a silicon substrate.

SiC beams have been implemented using hydrogen ion implant and splitting, but the hydrogen ion implantation limits the SiC beam thickness to approximately 1 μm. SiC beams have also been implemented by photoelectrochemical selective etching, but the SiC beam thickness has been approximately 1 μm thick. Previous implementations have not discussed the use of a semi-insulating SiC substrate, which enables low parasitic capacitance for electrostatic sense electrodes. The approach of the present invention is to use direct wafer bonding of a top hexagonal single-crystal SiC second substrate used to form a suspended beam and anchor structure to a bottom semi-insulating single-crystal SiC first substrate.

BRIEF SUMMARY OF THE INVENTION

The present invention provides a structure and method of making a suspended beam silicon carbide MEMS structure (e.g., gyroscope, accelerometer, oscillator, inertial sensor) with low capacitance and good thermal expansion match of the suspended beam SiC material and anchor material to the first substrate SiC material. SiC provides higher modulus, higher density, and higher thermal conductivity than silicon, which are desirable properties for SiC MEMS systems. Hexagonal SiC provides superior isoelasticity (rotation symmetry) versus silicon reducing errors in gyroscope functioning. SiC provides higher stiffness and fracture toughness than silicon, improving shock resistance for high-G applications (e.g., missiles, rail gun projectile). SiC provides improved radiation hardness compared to silicon. SiC single-crystal hexagonal material bonded to SiC single-crystal hexagonal first substrate provides good thermal expansion match.

SiC material properties provide significant advantages for MEMS devices. A thick top hexagonal SiC N+ suspended beam enables lower noise. The use of single-crystal hexagonal SiC for both the top N+ suspended beams, the anchor material structure, and the optional electrostatic sense electrode and the bottom handle first substrate enables good thermal expansion match and low stresses. The use of semi-insulating SiC bottom first substrate enables low parasitic capacitance for electrostatic sense electrode and thus improved noise properties. Several other features (e.g., top side ohmic contact, bottom side ohmic contact, undercut, recesses) are described to implement improved SiC MEMS structures. SiC material has higher modulus, higher density, higher thermal conductivity, improved rotational symmetry, higher fracture strength, higher shock resistance, high radiation resistance than silicon.

These and other features and advantages of the invention, as well as the invention itself, will become better understood by reference to the following detailed description, appended claims, and accompanying drawings.

DETAILED DESCRIPTION OF THE INVENTION

The present invention provides one or more than one suspended material structures comprising a hexagonal SiC material having a first surface and a second surface with each suspended material structure attached (fixed) to one or more than one anchor material structures. The anchor material structure comprises a hexagonal SiC material. In one embodiment, the anchor material structure is bonded (attached) to the substrate and the suspended material structure is not attached to the substrate. In one embodiment, the suspended material structure is electrically conductive and is doped either N-type or P-type. The substrate may have an etched recess region on the substrate first surface to facilitate the formation of the movable suspended material structures. The first substrate may have patterned electrically conductive electrodes on the first substrate first surface, within recesses etched into the first substrate. The patterned electrical electrodes on the first substrate surface beneficially prevent charge buildup on the surface, which can cause electrical non-uniformities. The electrical electrode ohmic contact can be formed on the first surface (topside) of the SiC material structure anchor material structure.

Example—Hexagonal SiC (4H-SiC or 6H-SiC)

This example includes process steps for the hexagonal SiC (4H-SiC or 6H-SiC) material structure bonded to a substrate and form suspended material structures that can be used for microelectromechanical beam, membranes, cantilevers, bridges, etc. In one embodiment, there is one or more than one suspended material structure that comprises hexagonal 4H-SiC material or hexagonal 6H-SiC material having a first surface and a second surface with each suspended material structure attached (fixed) to one or more than one anchor material structures that are direct wafer bonded (at the interface between two interface material layers) to a substrate. The anchor material structure comprises 4H-SiC or 6H-SiC material. In one embodiment, the anchor material structure and the suspended material structure are formed from a hexagonal SiC 4H-SiC material and the anchor material structure is bonded (attached) to the first substrate and the suspended material structure is not attached to the first substrate. The first substrate may be a semi-insulating or insulating SiC substrate. The first substrate may have an etched recess region on the first substrate first surface to facilitate the formation of the movable suspended material structures. The first substrate may have patterned electrically conductive electrodes on the first substrate first surface, within recesses etched into the first substrate. The electrical electrode ohmic contact can be formed on the first surface (topside) of the hexagonal 4H-SiC material structure anchor material structure.

Figure 1:
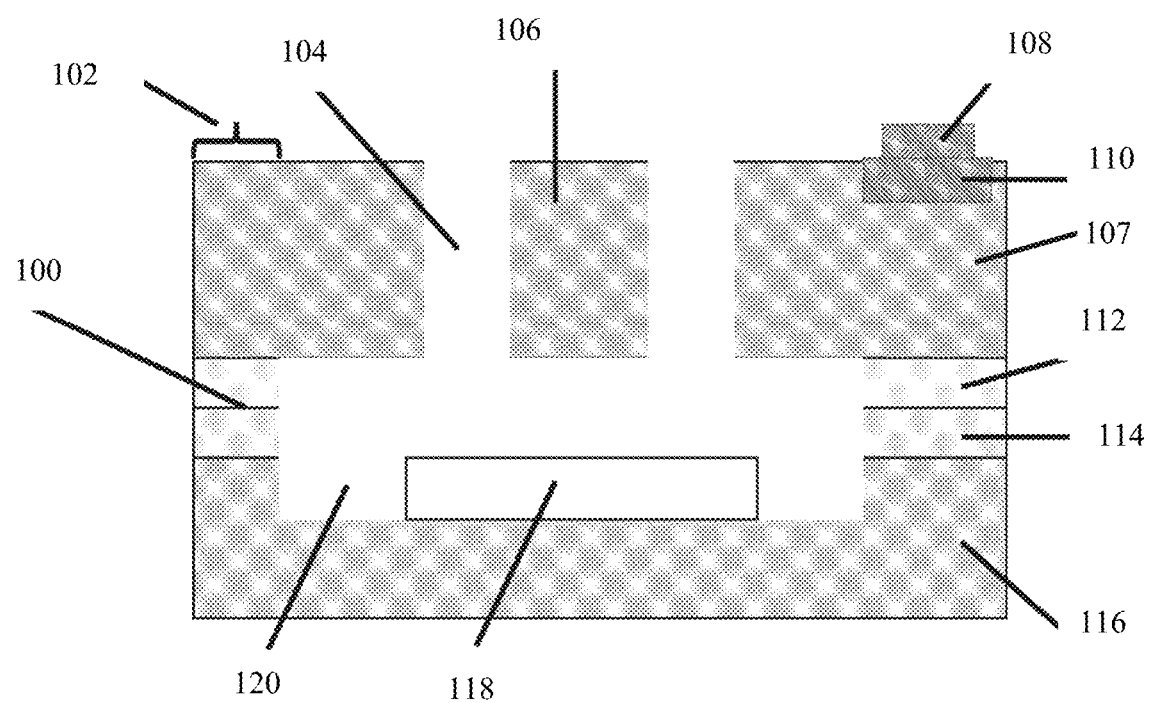
FIG. 1 is a schematic of a hexagonal 4H-SiC suspended material structure and anchor material structure with anchor material structure interface material layer(s) direct wafer bonded with 4H-SiC suspended material structure to form one or more than one attached regions (clamped regions) to the anchor material structure to form beams, membranes, cantilevers, or bridges for MEMS applications.

FIG. 1 shows a 4H-SiC suspended material structure and anchor material structure with anchor material structure interface material layer(s) direct wafer bonded with 4H-SiC suspended material structure to form one or more than one attached regions (clamped regions) to the anchor material structure to form beams, membranes, cantilevers, or bridges for MEMS applications. 6H-SiC first substrate with a recess etch region in the first substrate and an RIE etch protect material layer in the recess region that can optionally be an electrical electrode. The structure comprises a direct wafer bond interface 100, an anchor material structure region 102, trench etched regions 104, movable suspended 4H-SiC material structures 106 (beams, membranes, cantilever, or bridges) with one or more than one attachments to anchor structure material for MEMS applications, an optional electrostatic sense electrode 107, an electrical electrode contact 108 to second SiC substrate or thinned SiC second substrate, an optional doped region 110 in SiC to reduce ohmic contact resistance, an interface material layer 1 (optional CMP polished) 114, an interface material layer 2 (optional CMP polished) 112, a semi-insulating or insulating 4H-SiC or 6H-SiC first substrate 116, an RIE etch protect layer (optionally electrical conductive electrode) 118, and recess regions 120.

Hexagonal SiC Material

The suspended material structure, the anchor material structure, and the optional electrostatic sense electrode may be hexagonal 4H-SiC material or hexagonal 6H-SiC material.

The thickness of the hexagonal SiC may be in the range of about 50 nm to about 500 microns. For many applications, it is advantageous that the suspended material structure that forms a suspended beam be thicker to have a higher mass in the suspended beam that enables a lower Brownian mechanical noise. The Brownian noise corresponds to an equivalent acceleration noise of $$A_n^2 = (4k_B Tb)/m^2$$

Where $k_B$ is the Boltman's constant, T is the temperature in Kelvin, b is the damping coefficient, and M is the proof mass. A suspended material structure with a thickness in the range of about 1 micron to about 500 microns can be formed by wafer bonding a bulk hexagonal 4H-SiC or 6H-SiC second substrate and then thinning the hexagonal second substrate to selected thickness. This is to be contrasted with the thickness capability for cubic 3C-SiC. Cubic 3C-SiC is typically grown on a silicon substrate and is limited to a thickness less than 20 microns, and has high levels of residual stress and high levels of defects. In some embodiments, an hexagonal SiC suspended material structure can be about 1 microns thick. In some embodiments, an hexagonal SiC suspended material structure can be about 2 microns thick. In some embodiments, a hexagonal SiC suspended material structure can be about 4 microns thick. In some embodiments, a hexagonal SiC suspended material structure can be about 10 microns thick. In some embodiments, a hexagonal SiC suspended material structure can be about 20 microns thick. In some embodiments, a hexagonal SiC suspended material structure can be about 40 microns thick. In some embodiments, a hexagonal SiC suspended material structure can be about 100 microns thick. In some embodiments, a hexagonal SiC suspended material structure can be about 200 microns thick. In some embodiments, a hexagonal 4H-SiC suspended material structure can be about 500 microns thick.

It is desirable that the suspended material structure beam be mechanically anchored in a manner that reduces or eliminates transfer of strain from the first substrate into the suspended material structure beam so that the microelectromechanical device or transducer is strain-tolerant. The technique includes using an electrical insulator for mechanical coupling and electrical isolation. The transfer of strain from the first substrate is also minimized by using a semi-insulating or insulating single-crystal hexagonal SiC first substrate so that the linear coefficient of thermal expansion is about equal for both the first substrate and the 4H-SiC suspended and anchor material structure.

In some embodiments, the aggregate linear thermal expansion coefficient of the first substrate may have a value that is within about 1 percent of the thermal expansion coefficient on the SiC material for the SiC suspended beam, within about 2 percent of the thermal expansion coefficient on the SiC material for the SiC suspended beam, within about 5 percent of the thermal expansion coefficient on the SiC material for the SiC suspended beam, within about 10 percent of the thermal expansion coefficient on the SiC material for the SiC suspended beam, within about 20 percent of the thermal expansion coefficient on the SiC material for the SiC suspended beam.

A significant advantage of the use of bulk and epitaxial hexagonal single-crystal SiC material for the suspended material structure and the anchor structure is that bulk hexagonal single-crystal SiC used for the suspended beam can have residual stress less than about 100 MPa in some embodiments, residual stress less than about 50 MPa in some embodiments, residual stress less than about 20 MPa in some embodiments, and can have residual stress less than about 10 MPa in some embodiments. This is contrasted with 3C-SiC, which typically has a residual stress greater than 400 MPa.

An advantage of 4H-SiC material for the suspended material structure and the anchor material structures is that 4H-SiC material has a dislocation density less than about $1\times10^5$ cm$^{-2}$ (Salwe et al., "Bulk growth of SiC—review on advances of SiC vapor growth for improved doping and systematic study on dislocation evolution," Silicon Carbide, Vol. 1: Growth, Defects, and Novel Applications, edited by Peter Friedrichs, Tsunenobu Kimoto, Lotar Ley, and Gerhard Pensl, 2010 WILEY-VCH Verlag GmbH & Co. KGaA, Weinheim ISBN: 978-3-527-40953-2). The values for the (0006) X-ray rocking curve were less than about 0.135 degrees FWHM and about 0.047 degrees FWHM for high temperature growth. Other reports for dislocation density of less than $1\times10^4$ cm$^{-2}$ (Omote, "Crystal defect in SiC wafers and a new X-ray topography system," The Rigoku Journal, 29(1) pp. 1-8 (2013) and Paskova, Nitrides with Nonpolar Surfaces: Growth Properties and Devices, page 76). While not available commercially, the best reported dislocation density for bulk 4H-SiC is about $1\times10^2$ cm$^{-2}$ (Nakamur et al., "Ultrahigh-quality Silicon Carbides," Nature 430, 1009 (2004)). A low dislocation density is desirable to reduce the mechanical loss in suspended material structure beam and achieve high "Q" values. This contrasted with cubic 3C-SiC which has high levels of dislocation density because of growth on lattice mismatched silicon substrates.

A lower 4H-SiC dislocation density can be obtained by growth of 4H-SiC epitaxial layers on 4H-SiC substrate. The 4H-SiC epitaxial layers on 4H-SiC substrate can have a dislocation density less than about $1\times10^4$ cm$^{-2}$.

The epitaxial growth of 4H-SiC material layers on 4H-SiC bulk substrates requires the use of off-axis orientation from the (0001) c-axis or from the (000-1)(overbar) c-axis of more than about 2 degrees in some embodiments, more than 4 degrees in some embodiments, and more than about 8 degrees in some embodiments.

The hexagonal SiC suspended material structure, the anchor material structure, and the optional electrostatic sense electrode may be doped N-type or P-type. The resistivity of the hexagonal SiC suspended material structure, the anchor material structure and the optional electrostatic sense electrode may in some embodiments be in about 0.015 ohm-cm, in some embodiments be in about 0.025 ohm-cm, in some embodiments be in about 0.05 ohm-cm, in some embodiments be in about 0.1 ohm-cm, in some embodiments be in about 0.2 ohm-cm, in some embodiments be in about 0.5 ohm-cm, in some embodiments be in about 1.0 ohm-cm, in some embodiments be in about 5.0 ohm-cm, and in some embodiments be in about 20.0 ohm-cm.

The suspended material structure, the anchor material structure material, and the optional electrostatic sense electrode may be formed from a bulk single-crystal hexagonal 4H-SiC or 6H-SiC substrate. The suspended material structure, the anchor material structure material, and the optional electrostatic may be a thinned bulk single-crystal hexagonal 4H-SiC or 6H-SiC substrate. The single-crystal hexagonal SiC material has a high modulus.

The suspended material structure beam can be widely applied to a variety of sensors. For example, a variable capacitor may be simply formed by adjusting the distance between two adjacent suspended beams. In such way, the MEMS sensor (e.g. an accelerometer) will be further fabricated. The suspended material structure may comprise a suspended 4H-SiC material layer structure that is single-clamped or double-clamped to SiC material layer structure(s) that is (are) connected to an anchor.

Interface Material Layer

The interface material layer can have the properties of low surface roughness suitable for direct wafer bonding, lateral undercut to facilitate the fabrication of a movable suspended material structure. The interface material layer(s) can include, but not be limited to, a silicon oxide material layer. The interface material layer can absorb hydrogen that is advantageous for direct wafer bonding. The interface material layer can have a surface roughness of less than about 0.5 nm RMS that is advantageous for direct wafer bonding (fusion wafer bonding). The surface of the interface material layers can be chemical mechanical polished to reduce the surface roughness to less than about 0.5 nm RMS. The interface material layers can optionally be laterally undercut to enable a movable suspended material structure using processes such as HF vapor etching, anhydrous HF vapor etching, and wet chemical dilute HF etching for the case of a silicon oxide interface material layer.

Figure 2:
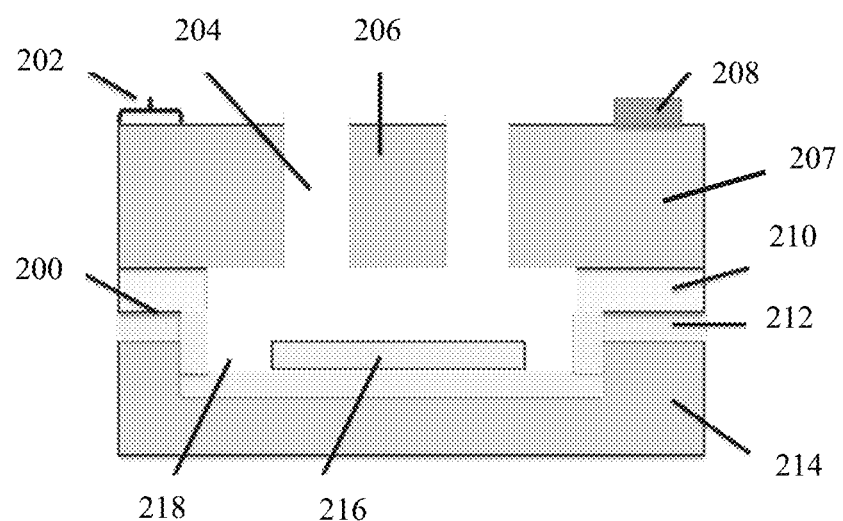
FIG. 2 is a schematic of hexagonal 4H-SiC on laterally undercut interface material layer(s) on a hexagonal 6H-SiC substrate with trenches etched in 4H-SiC suspended material structure to form one or more than one attached regions (clamped regions) to the anchor material structure to form beams, membranes, cantilevers, or bridges for MEMS applications.

FIG. 2 shows 4H-SiC on laterally undercut interface material layer(s) on a 6H-SiC substrate with trenches etched in 4H-SiC suspended material structure to form one or more than one attached regions (clamped regions) to the anchor material structure to form beams, membranes, cantilevers, or bridges for MEMS applications. 6H-SiC first substrate with a recess etch region in the first substrate and an RIE etch protect material layer in the recess region that can optionally be an electrical electrode. The structure comprises a direct wafer bond interface 200, an anchor material structure region 202, trench etched regions 204, movable suspended 4H-SiC material structures 206 (beams, membranes, cantilever, or bridges) with one or more than one attachments to anchor structure material for MEMS applications, an optional electrostatic sense electrode 207, an electrical electrode contact to SiC 208, an interface material layer 1 (optional CMP polished) 212, an interface material layer 2 (optional CMP polished) 210, a 6H-SiC first substrate (optionally semi-insulating) 214, an RIE etch protect layer (optionally electrical electrode) 216, and a lateral undercut of one or more than one interface material layers to form undercut regions 218.

First Substrate

The first substrate may be a semi-insulating or insulating single-crystal hexagonal 4H-SiC or 6H-SiC substrate. The substrate may include, but not be limited to, a high mechanical strength substrate, a high thermal conductivity substrate, a matched thermal conductivity substrate, a low total thickness variation (TTV) substrate, a substrate with low total thickness variation (TTV) and also an low thickness uncertainty, a substrates with patterned electrical electrodes on the surface of the substrate, a substrate with patterned electrical electrodes formed in the recesses of the substrate, a low cost substrate, an optically transparent substrate, or any combination thereof. The first substrate properties may include, but not be limited to, a semi-insulating SiC substrate or an insulating SiC substrate. The first substrate may be patterned and etched to form recessed regions in the first substrate. Electrical electrodes may be formed in the recess.

Semi-insulating or insulating hexagonal 4H-SiC or 6H-SiC have the properties that the substrates have high mechanical strength substrate, high thermal conductivity substrate (>300 W/mK), can be a semi insulating substrate (>1×10$^5$ ohm-cm), and can be an insulating substrate.

The hexagonal 4H-SiC material that is used to form the suspended material structure can be bonded on a first substrate with approximately matched linear coefficient of thermal expansion. An advantage of have a substrate with a linear coefficient of expansion that about matches the linear thermal expansion coefficient of the 4H-SiC material layer is that the matched thermal coefficient of expansion facilitates the wafer bonding of the two material layer. Material layers with different thermal expansion coefficient can debond, crack and have significant wafer bow during from higher temperature processes such as annealing to increase the bond strength or growth of a thermal oxide layer. The semi-insulating or insulating 4H-SiC or 6H-SiC first substrate approximately matches the linear thermal coefficient of expansion of the single crystal hexagonal SiC layer used to form the suspended material structure. Thus, very thick 4H-SiC material layers can be bonded without extensive substrate or wafer bow. For example, the hexagonal 4H-SiC or 6H-SiC material layer may be about 20 microns thick in some embodiments, 40 microns thick in some embodiments, about 100 microns thick in some embodiments, about 200 microns in some embodiments, and about 500 microns thick in some embodiments.

Suspended Microelectromechanical Material Structures

A MEMS device may be configured as a resonator that is used in timing devices. The resonator may have a variety of physical shapes, e.g., beams and plates. The MEMS device may have a portion suspended from the first substrate (e.g., a suspended mass, body, or resonator) attached to the first substrate by an anchor. The suspended material structure may be a feature such as, but not limited to, a beam, a plate, a bridge, a cantilever arm, or a tuning fork. In a specific embodiment, a MEMS device includes a resonating feature (e.g., suspended mass) flanked by one or more drive electrodes and one or more sense electrodes.

In some embodiments, the movable suspended material structure(s) comprise a hexagonal 4H-SiC material layer on a silicon oxide layer on a first substrate that is laterally undercut to form a movable suspended material structure beam.

In some embodiments, the movable suspended material structure(s) comprise a 4H-SiC material layer on a first substrate with etched recess regions to aid in enabling movable suspended material structures. The first substrate may have patterned electrical electrodes within the etched recesses.

A recess region can be formed in the first substrate on the first substrate first surface prior to the wafer bonding on the 4H-SiC material layer. The recess region can enable movable 4H-SiC material structures that are formed by plasma etching of trenches vertically entirely through 4H SiC material layer. An etch protect material layer may be formed within the recess region that can also function as an electrical electrode.

Thinning of 4H-SiC Material Layer

After wafer bonding of the 4H-SiC material to the first substrate at the interface material surfaces, the 4H-SiC material that is used to form the suspended material structure can be thinned to a selected thickness by a combination of grinding, CMP polishing, and/or RIE etching. The selected thickness of the 4H-SiC material used to form the suspended material structure can be for example 1 micron thick, 2 micron thick, 4 micron thick, 10 micron thick, 20 micron thick, 40 micron thick, 100 micron thick, 200 micron thick, or 500 micron thick. One approach to reduce the residual stress and subsurface damage at the first surface of the suspended material structure of the thinning operation is to use a stress release chemical mechanical polish (CMP) and/or a plasma etch process.

Deep Trench SiC Etching

In some MEMS devices, the actuation or sensing can be by electrostatic coupling. The deep trench etching of 4H-SiC can be performed by approaches that include but are not limited to RIE etching or ICP RIE etching. The inductively coupled plasma (ICP) RIE etching often has etch rates of 500 nm per minute to 1000 nm per minute. The sidewall angle of the deep trench can be in the range of about 3 degrees to 15 degrees off of the vertical axis. The aspect ratio of the deep trench can be in the range of greater than 5 to 1 to greater than 100 to 1. The electrostatic coupling between the suspended material structure and the anchor material structure is dependent on the width of the trench etched region. The width of the trench can be as small as about 0.5 microns or as large as about 5 to 8 microns. The width of the deep trench can be about 1 micron for a suspended material structure that is less than about 10 microns thick. The width of the deep trench can be about 2 micron for a suspended material structure that is less than about 20 microns thick. The width of the deep trench can be about 3 micron for a suspended material structure that is less than about 40 microns thick. The width of the deep trench can be about 4 micron for a suspended material structure that is less than about 60 microns thick. The deep trench etch entirely through the thickness of the N-type hexagonal single-crystal layer can be performed by ICP-RIE SiC etching using gases such SF6 plus argon, oxygen, or other gases to form movable suspended material structures above the recesses.

Electrostatic coupling to a 4H-SiC beam typically requires that the beam have an electrical conductivity and thus it is typically preferred that the 4H-SiC material be doped N-type with a doping concentration in the range of $5 \times 10^{18}$ cm$^{-3}$ to $1 \times 10^{19}$ cm$^{-3}$. Commercial 4H-SiC or 6H-SiC substrates can be N-type. 4H-SiC epitaxial layers can be grown to be N-type or P-type.

Methods

Example Method 1: Metal electrode contact to the first surface of the anchor material structure.

1. 6H-SiC semi-insulating or insulating first substrate.
2. Thin and polish the 6H-SiC semi-insulating first substrate to a low total thickness variation (TTV) and to a selected thickness.
3. Photolithography step 1: Photodefine region for etching alignment marks in the semi insulating first substrate.
4. RIE etch alignment marks about 0.1-0.3 microns deep into the 6H semi-insulating SiC first substrate and strip etch-mask.
5. Photolithography step 2: Photodefine region for etching a recess in the first surface of the semi-insulating first substrate.
6. RIE etch a recess about three microns deep into the first surface of the 6H semi-insulating first substrate and strip etch-mask.
7. Grow about 40 nm thermal oxide interface material layer on first surface and recess surface of the semi-insulating first substrate.
8. Grow about 40 nm thick thermal oxide on N-type 4H-SiC second substrate.
9. Photolithography step 3: Photodefine RIE etch protect material layer. The RIE etch protect layer is a material layer that has a slow etch rate in the SiC RIE etch gases. The RIE etch protect layer may include but not be limited to nickel metal layer or aluminum metal layer. The RIE etch protect layer can also be an electrical electrode.
10. Direct wafer bond the first surface of the 4H or 6H semi-insulating SiC surface to the N-type doped 4H-SiC material.
11. Anneal at 400° C. to 1100° C. to increase the bond strength of the direct wafer bonded region.
12. Thin the N-type doped 4H-SiC material to 40 micron final thickness and perform CMP polish to minimize stress and remove subsurface damage.
13. Photolithography step 4: Photodefine region for etching top-side alignment marks in the N type doped 4H-SiC material.
14. RIE etch alignment marks about 0.1-0.3 microns deep into the N-type doped 4H-SiC material and strip etch-mask.
15. Photolithography step 5: Photodefine a metal layer that makes ohmic contact to N-type 4H SiC first surface. A thin titanium layer (about 10 nm) and a nickel layer about 100 nm thick can be used to make an ohmic contact to the first surface of the N-type 4H-SiC material layer after heat-treatment.
16. Photolithography step 6: Photodefine a gold layer 300 nm or thicker that can facilitate the wire bonding to the metal on the first surface of the N-type 4H-SiC material layer.
17. Photolithography step 7: Photodefine a protect layer material layer that protects the metal for the ohmic contact to the first surface of the N-type 4H-SiC material layer. The protect layer material may be gold or another material resistant to the chemicals used in subsequent steps.
18. Photolithography step 8: Photodefine a material layer that performs as a RIE etch definition layer for the SiC trench etch on the first surface of the N-type 4H-SiC. The RIE etch definition layer that defines where SiC will be etched can be a nickel layer or an aluminum layer, for example. The nickel layer can be formed by electroplating nickel inside of a photodefined resist mode or deposition of nickel and a resist or dielectric masking layer followed by a subtractive etch using ion beam milling or plasma etching. Nickel can also be etched by chemical etching. The aluminum layer can be subtractive etched by RIE plasma etch.
19. Perform the ICP-RIE SiC trench etch entirely through the thickness of the N-type 4H-SiC layer using gases such SF6 plus argon, oxygen, or other gases to form movable suspended material structures above the recesses.
20. Etch the interface material layer 2 using an HF vapor etch, an anhydrous HF vapor etch or a dilute HF vapor etch.
21. Remove the nickel masking layer and then perform critical point drying to prevent striction.
22. Shadow mask deposit gold wire-bond pads for contact to recess metal.
23. Separate, die-bond, and wire-bond to MEMS die.

Figure 3:
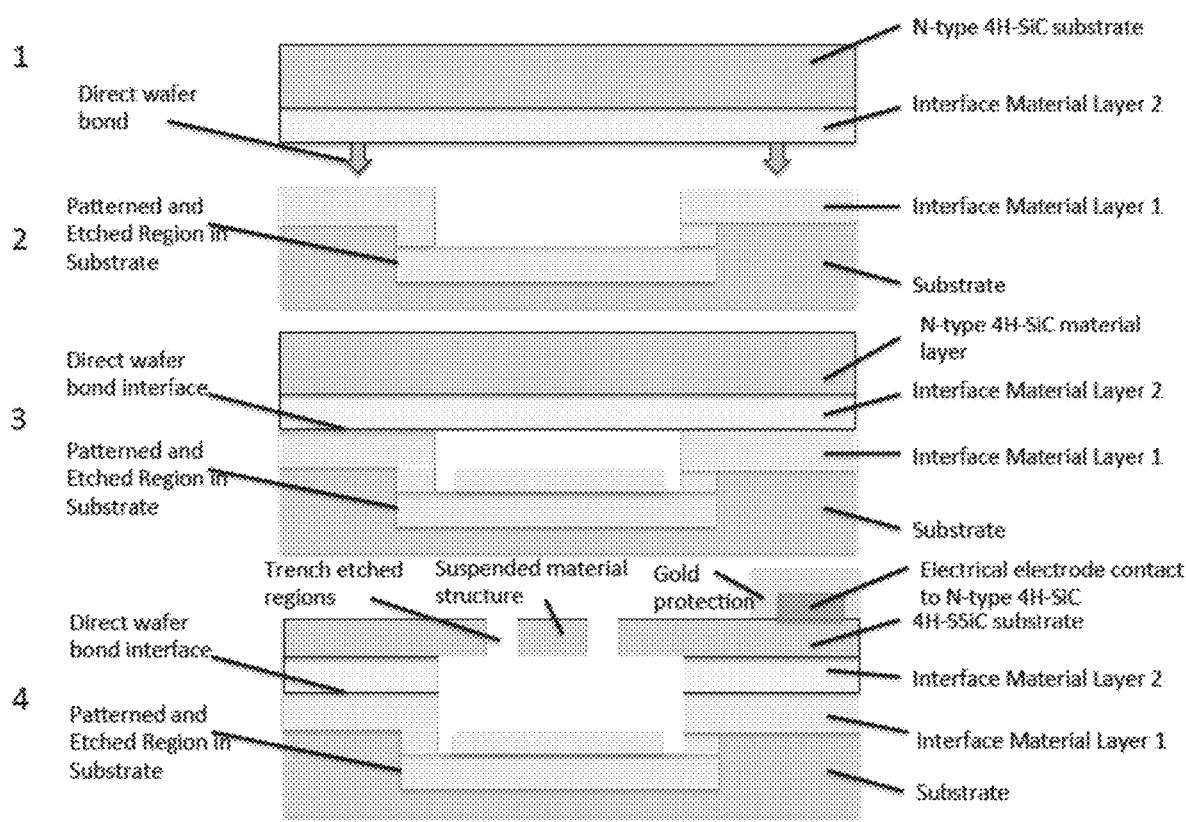
FIG. 3 is a schematic of a method to wafer bond hexagonal 4H-SiC material to a substrate with etched recess region and reactive-ion etching (RIE) protect material layer.

FIG. 3 shows an example method to wafer bond 4H-SiC material to a substrate with etched recess region and RIE protect material layer.

Example—Advanced Silicon Carbide Structure, Devices and Method

This method includes process steps for the hexagonal single-crystal SiC anchor material structure bonded to a substrate and forming suspended material structures that can be used for microelectromechanical beam, membranes, cantilevers, bridges etc.

Example Device Embodiment 1

In one embodiment, one or more than one suspended material structures comprise a hexagonal single-crystal SiC material having a first surface and a second surface with each suspended material structure attached (fixed) to one or more than one anchor material structures that are bonded to a substrate with no interface material layer, one optional interface material layer or more than one optional interface material layers at the interface between the hexagonal single-crystal SiC material layer and the substrate. The anchor material structure comprises hexagonal single-crystal hexagonal SiC material. The anchor material structure and the suspended material structure are formed from a single-crystal hexagonal SiC material and the anchor material structure is bonded (attached) to the substrate and the suspended material structure is not attached to the substrate. The substrate may be a hexagonal single-crystal SiC substrate which may be conductive with N-type doping, conductive with P type doping, semi-insulating or insulating. Other types of substrates may include but not be limited to a silicon substrate, a glass substrate, or a ceramic substrate. The substrate may have an etched recess region on the substrate first surface to facilitate the formation of the movable suspended material structures. The substrate may have patterned electrical electrodes on the substrate first surface, within recesses etched into the substrate, and within recesses etched into the substrate and on the substrate first surface. The electrical electrode ohmic contact can be formed on the first surface (topside) of the hexagonal single-crystal material structure anchor material structure.

Figure 4:
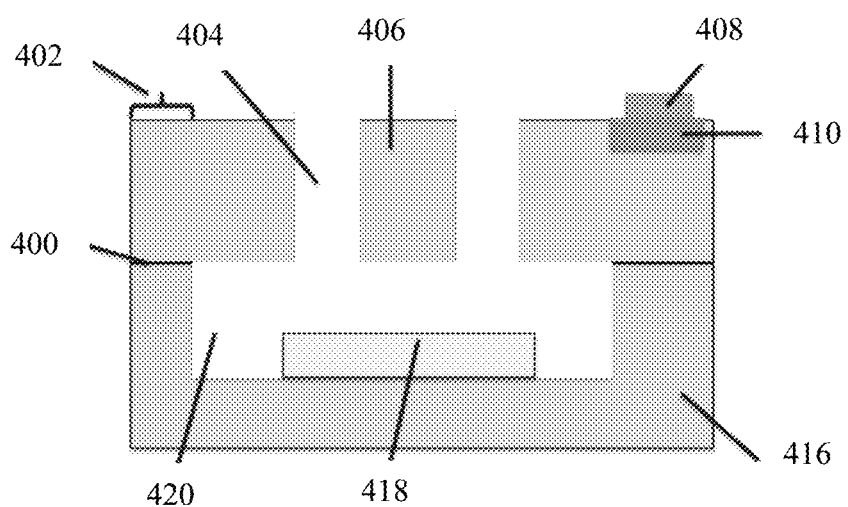
FIG. 4 is a schematic of a hexagonal single-crystal SiC on a hexagonal single-crystal semi-insulating SiC substrate (with etched recess region(s)) with high thermal conductivity direct wafer bond interface with trenches etched in hexagonal single-crystal SiC suspended material structure to form one or more than one clamped attachment to the anchor material region to form beams, membranes, cantilevers, or bridges for MEMS applications.

FIG. 4 shows hexagonal single-crystal SiC on a hexagonal single-crystal semi-insulating SiC substrate (with etched recess regions(s)) with high thermal conductivity direct wafer bond interface with trenches etched in hexagonal single-crystal SiC suspended material structure to form one or more than one clamped attachments to the anchor material region to form beams, membranes, cantilevers, or bridges for MEMS applications. The structure comprises a high thermal conductivity direct wafer bond interface 400, an anchor material structure region 402, trench etched regions 404, movable suspended hexagonal single-crystal SiC material structures 406 (beams, membranes, cantilever, or bridges) with one or more than one attachments to anchor structure material for MEMS applications, an electrical electrode contact to SiC 408, an optional doped region 410 in SiC to reduce ohmic contact resistance, a hexagonal single-crystal semi-insulating SiC substrate 416, an RIE etch protect layer (optionally electrical electrode) 418, and recess regions 420.

Figure 5:
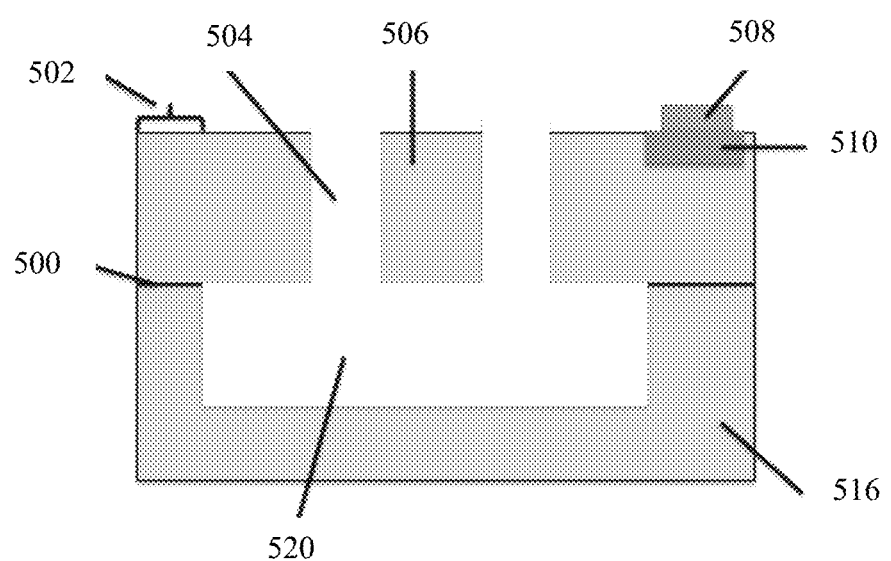
FIG. 5 is a schematic of a hexagonal single-crystal SiC on a hexagonal single-crystal semi-insulating SiC substrate (with etched recess regions(s)) with high thermal conductivity direct wafer bond interface with trenches etched in hexagonal single-crystal SiC suspended material structure to form one or more than one clamped attachment to the anchor material region to form beams, membranes, cantilevers, or bridges for MEMS applications.

FIG. 5 shows hexagonal single-crystal SiC on a hexagonal single-crystal semi-insulating SiC substrate (with etched recess regions(s)) with high thermal conductivity direct wafer bond interface with trenches etched in hexagonal single-crystal SiC suspended material structure to form one or more than one clamped attachments to the anchor material region to form beams, membranes, cantilevers, or bridges for MEMS applications. The structure comprises a high thermal conductivity direct wafer bond interface 500, an anchor material structure region 502, trench etched regions 504, movable suspended hexagonal single-crystal SiC material structures 506 (beams, membranes, cantilever, or bridges) with one or more than one attachments to anchor structure material for MEMS applications, an electrical electrode contact to SiC 508, an optional doped region 510 in SiC to reduce ohmic contact resistance, a hexagonal single-crystal semi-insulating SiC substrate 516, and recess regions 520.

Hexagonal Single-Crystal SiC Material

The hexagonal single-crystal SiC material in the suspended material structure, the anchor material structure, and the sense electrode material structure may include, but not be limited to, single-crystal 6H-SiC material and single crystal 4H-SiC material.

The thickness of the hexagonal single-crystal SiC may be in the range of about 50 nm to 200 microns. For many applications, it is advantageous that the suspended material structure that forms a suspended beam be thicker to have a higher mass in the suspended beam that enables a lower Brownian mechanical noise. The Brownian noise corresponds to an equivalent acceleration noise of $$A_n^2 = (4k_B T b)/m^2$$

Where $k_B$ is the Boltman's constant, T is the temperature in Kelvin, b is the damping coefficient, and M is the proof mass. A suspended material structure with a thickness in the range of about 1 micron to 500 microns can be formed by wafer bonding a bulk hexagonal single-crystal SiC substrate and then thinning to selected thickness. This is to be contrasted with the thickness capability for cubic 3C-SiC. Cubic 3C-SiC is typically grown on a silicon substrate and is limited to a thickness less than 20 microns, and has high levels of residual stress and high levels of defects. A hexagonal single-crystal SiC suspended material structure in the range of about 50 nm to 2 micron thick can be formed using a wafer bonding and hydrogen ion material splitting approach. In some embodiments, a hexagonal single-crystal SiC suspended material structure can be about 50 nm thick. In some embodiments, a hexagonal single-crystal SiC suspended material structure can be about 100 nm thick. In some embodiments, a hexagonal single-crystal SiC suspended material structure can be about 500 nm thick. In some embodiments, a hexagonal single-crystal SiC suspended material structure can be about 1 micron thick. In some embodiments, a hexagonal single-crystal SiC suspended material structure can be about 2 microns thick. In some embodiments, a hexagonal single-crystal SiC suspended material structure can be about 4 microns thick. In some embodiments, a hexagonal single-crystal SiC suspended material structure can be about 10 microns thick. In some embodiments, a hexagonal single-crystal SiC suspended material structure can be about 20 microns thick. In some embodiments, a hexagonal single-crystal SiC suspended material structure can be about 40 microns thick. In some embodiments, a hexagonal single-crystal SiC suspended material structure can be about 100 microns thick. In some embodiments, a hexagonal single-crystal SiC suspended material structure can be about 200 microns thick. In some embodiments, a hexagonal single-crystal SiC suspended material structure can be about 500 microns thick.

It is desirable that the suspended material structure have low residual stress or strain and relatively low induced stress or strain from changes in operation temperature. The hexagonal single-crystal SiC suspended material structure may be formed by thinning a bonded hexagonal single-crystal SiC substrate after wafer bonding. One approach to reduce the residual stress and subsurface damage at the first surface of the suspended material structure of the thinning operation is to use a stress release chemical mechanical polish (CMP) and/or a plasma etch process. In addition, the stress in the hexagonal single-crystal suspended material structure as the operation temperature changes can be minimized by using a SiC substrate so that the linear coefficient of thermal expansion is about equal for both the substrate and the hexagonal single crystal suspended material structure. A significant advantage of the use of bulk and epitaxial hexagonal single-crystal SiC material for the suspended material structure and the anchor structure is that bulk hexagonal single-crystal SiC can have residual stress less than about 100 MPa in some embodiments and can have residual stress less than about 20 MPa in some embodiments. This is contrasted with 3C-SiC which typically has a residual stress greater than 400 MPa.

It is desirable that the suspended material structure beam be mechanically anchored in a manner that reduces or eliminates transfer of strain from the substrate into the suspended material structure beam so that the microelectromechanical device or transducer is strain-tolerant. The technique includes using an electrically insulating for mechanical coupling and electrical isolation. The transfer of strain from the substrate is also minimized by using a SiC substrate so that the linear coefficient of thermal expansion is about equal for both the substrate and the hexagonal single-crystal suspended material structure stress as the operation temperature changes can be minimized.

An advantage of hexagonal single-crystal SiC material for the suspended material structure and the anchor material structure is that hexagonal single-crystal material SiC material has a dislocation density less than about $1\times10^5$ cm$^{-2}$ (Salwe et. al., "Bulk growth of SiC—review on advances of SiC vapor growth for improved doping and systematic study on dislocation evolution," Silicon Carbide, Vol. 1: Growth, Defects, and Novel Applications, Edited by Peter Friedrichs, Tsunenobu Kimoto, Lothar Ley, and Gerhard Pensl, 2010 WILEY-VCR Verlag GmbH & Co. KGaA, Weinheim ISBN: 978-3-527-40953-2). The values for the (0006) X-ray rocking curve were less than about 0.135 degrees FWHM and about 0.047 degrees FWHM for high temperature growth. Other reports for dislocation density of less than $1\times10^4$ cm$^{-2}$ (Ornate, "Crystal defect in SiC wafers and a new X-ray topography system," The Rigoku Journal, 29(1) pp. 1-8, 2013 and Paskova, "Nitrides with Nonpolar Surfaces: Growth Properties and Devices," page 76). While not available commercially, the best reported dislocation density for bulk hexagonal SiC is about $1\times10^2$ cm$^{-2}$ (Nakamur, et. al., "Ultrahigh-quality Silicon Carbide Single-crystals," Nature, 430 1009 (2004)). A low dislocation density is desirable to reduce the mechanical loss in suspended material structure beam and achieve high "Q" values. This contrasted with cubic single-crystal 3C-SiC which has high levels of dislocation density because of growth on lattice mismatched silicon substrates.

Hexagonal single-crystal SiC substrate can have a silicon face (0001) or a carbon face (000-1)(overbar).

A lower hexagonal single-crystal SiC dislocation density can be obtained by growth of hexagonal single-crystal epitaxial layers on hexagonal single-crystal SiC substrate. The hexagonal single-crystal epitaxial layers on hexagonal single-crystal SiC substrate can have a dislocation density less than about $1\times10^4$ cm$^{-2}$.

The epitaxial growth of hexagonal single-crystal SiC material layers on hexagonal single-crystal SiC bulk substrates requires the use of off-axis orientation of from the (0001) c-axis or from the (000-1)(overbar) c-axis of more than about 2 degrees in some embodiments, more than 4 degrees in some embodiments, and more than about 8 degrees in some embodiments.

The epitaxial growth of 4H-SiC single-crystal SiC material layers on the silicon face of hexagonal single-crystal SiC bulk substrates requires the use of off-axis orientation from the (0001) c-axis of more than about 2 degrees in some embodiments, more than 4 degrees in some embodiments, and more than about 8 degrees in some embodiments. The 4H-SiC epitaxial layers grown on the silicon face can be doped N-type or P-type to a selected doping level. 4H-SiC single-crystal SiC material layers can also be grown on the carbon face of 4H-SiC single-crystal substrates. The epitaxial growth of 4H-SiC single-crystal SiC material layers on the carbon face hexagonal single-crystal SiC bulk substrates requires the use of off-axis orientation from the (0001) c-axis of more than about 2 degrees in some embodiments, more than 4 degrees in some embodiments, and more than about 8 degrees in some embodiments. The 4H-SiC epitaxial layers grown on the carbon face can be doped N-type or P-type to a selected doping level.

Figure 6:
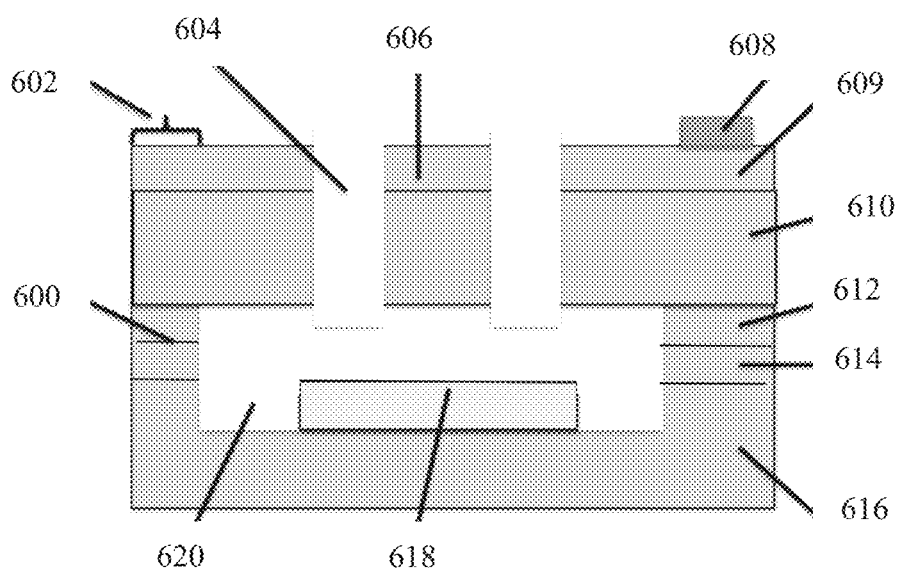
FIG. 6 is a schematic of a combination of N-type epitaxial hexagonal SiC and N+ bulk hexagonal single-crystal SiC on optional interface material layer(s) on a hexagonal single-crystal substrate with trenches etched in hexagonal single-crystal SiC suspended material structure with one or more attachments to the anchor material region to form beams, membranes, cantilevers, or bridges for MEM applications.

FIG. 6 shows a combination of N-type epitaxial hexagonal SiC and N+ bulk hexagonal single-crystal SiC on optional interface material layer(s) on a hexagonal single-crystal substrate with trenches etched in hexagonal single-crystal SiC suspended material structure with one or more attachments to the anchor material region to form beams, membranes, cantilevers, or bridges for MEM applications. The structure comprises a direct wafer bond interface 600, an anchor material structure region 602, trench etched regions 604, movable suspended hexagonal single-crystal SiC material structures 606 (beams, membranes, cantilevers, or bridges) with one or more than one attachments to anchor structure material for MEMS applications, an electrical electrode contact to SiC 608, an N+ bulk hexagonal single-crystal SiC material layer 609, an N-type epitaxial hexagonal single-crystal SiC material layer 610, an optional interface material layer 1 (optional CMP polished) 614, an optional interface material layer 2 (optional CMP polished) 612, a hexagonal single-crystal SiC substrate (optionally semi-insulating) 616, an RIE etch protect layer (optionally electrical electrode) 618, and recess regions 620.

Figure 7:
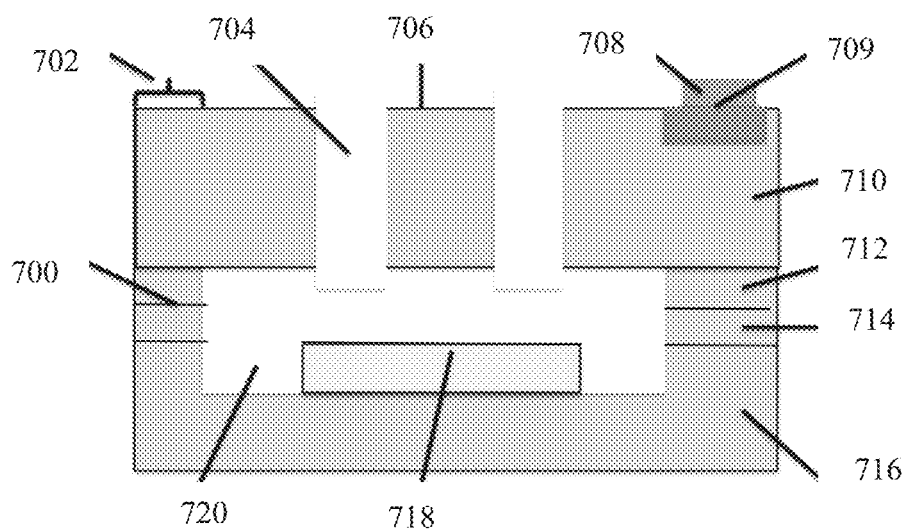
FIG. 7 is a schematic of a combination of N-type epitaxial hexagonal SiC and N+ bulk hexagonal single-crystal SiC on optional interface material layer(s) on a hexagonal single-crystal substrate with trenches etched in hexagonal single-crystal SiC suspended material structure with one or more attachments to the anchor material region to form beams, membranes, cantilevers, or bridges for MEM applications.

FIG. 7 shows a combination of N-type epitaxial hexagonal SiC and N+ bulk hexagonal single-crystal SiC on optional interface material layer(s) on a hexagonal single-crystal substrate with trenches etched in hexagonal single-crystal SiC suspended material structure with one or more attachments to the anchor material region to form beams, membranes, cantilevers, or bridges for MEM applications. The structure comprises a direct wafer bond interface 700, an anchor material structure region 702, trench etched regions 704, movable suspended hexagonal single-crystal SiC material structures 706 (beams, membranes, cantilevers, or bridges) with one or more than one attachments to anchor structure material for MEMS applications, an electrical electrode contact to SiC 708, an optional doped region 709 in SiC to reduce ohmic contact resistance, an N-type epitaxial hexagonal single-crystal SiC material layer 710, an optional interface material layer 1 (optional CMP polished) 714, an optional interface material layer 2 (optional CMP polished) 712, a hexagonal single-crystal SiC substrate (optionally semi-insulating) 716, an RIE etch protect layer (optionally electrical electrode) 718, and recess regions 720.

Figure 8:
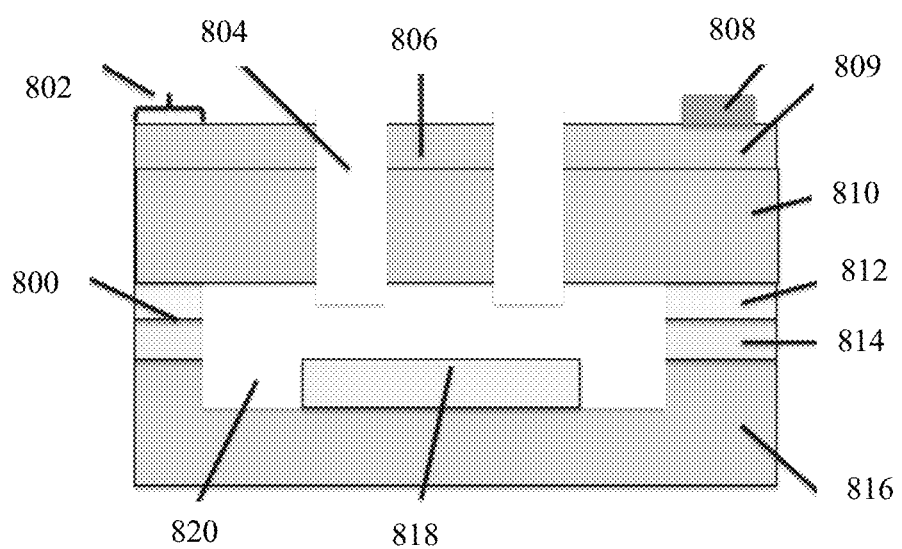
FIG. 8 is a schematic of a combination of N-type epitaxial hexagonal SiC and N+ bulk hexagonal single-crystal SiC on optional interface material layer(s) on a hexagonal single-crystal substrate with trenches etched in hexagonal single-crystal SiC suspended material structure with one or more attachments to the anchor material region to form beams, membranes, cantilevers, or bridges for MEM applications.

FIG. 8 shows a combination of N-type epitaxial hexagonal SiC and N+ bulk hexagonal single-crystal SiC on optional interface material layer(s) on a hexagonal single-crystal substrate with trenches etched in hexagonal single-crystal SiC suspended material structure with one or more attachments to the anchor material region to form beams, membranes, cantilevers, or bridges for MEM applications. The structure comprises a direct wafer bond interface 800, an anchor material structure region 802, trench etched regions 804, movable suspended hexagonal single-crystal SiC material structures 806 (beams, membranes, cantilevers, or bridges) with one or more than one attachments to anchor structure material for MEMS applications, an electrical electrode contact to SiC 808, an N+ bulk hexagonal single-crystal SiC material layer 809, an N-type epitaxial hexagonal single-crystal SiC material layer 810, an optional interface material layer 1 (optional CMP polished) 814, an optional interface material layer 2 (optional CMP polished) 812, a hexagonal single-crystal SiC substrate (optionally semi-insulating) 816, an RIE etch protect layer (optionally electrical electrode) 818, and recess regions 820.

The hexagonal single-crystal SiC suspended material structure and the anchor material structure may be doped N-type or P-type. The doping concentration in the hexagonal single crystal suspended material structure and anchor structure may be selected for a low doping concentration for some applications or for high doping concentrations in other applications. For example, a capacitive accelerometer would prefer a high doping concentration in the hexagonal single-crystal suspended material structure. The high doping concentration can be in the range of about $1\times10^{16}$ cm$^{-3}$ to about $1\times10^{20}$ cm$^{-3}$ doping concentration. A low doping concentration can be preferred for a suspended material structure. For example, a low doping in the suspended material structure for the case of thermally actuated MEMS oscillator in which case the suspended material structure can perform as a resistive thermal actuator. The low doping concentration can be in the range from about $5\times10^{13}$ cm$^{-3}$ to about $1\times10^{18}$ cm$^{-3}$ to enable a resistor that can be used for thermal actuation. There can be lateral patterned selected doping regions into the first and/or second surface of the hexagonal single-crystal SiC suspended material structure and anchor material structure formed by ion implantation and annealing of dopants or alternately by diffusion of dopants. There can be vertically stacked doping layer in the hexagonal single crystal SiC suspended material structure and anchor material structure formed by ion implantation and annealing of dopants, diffusion of dopants, or by epitaxial growth of vertically stacked doping layers. These doping regions and/or doping layers can be used to facilitate ohmic electrical contact formation to the suspended material structure and the anchor material structure. A high doping concentration is typically preferred for ohmic contact formation.

The fixed oxide charge on the surface of SiC is typically a positive fixed oxide charge. Thus, the surface of N-type SiC is typically accumulated while the surface of P-type SiC can be inverted of depleted. A high surface state density on the exposed surfaces of the SiC can degrade the "Q" of microelectromechanical devices and it can be desirable to reduce the surface state density. The surface state density on the surface of SiC can be reduced approaches such annealing oxide or growing oxides formed on the surface of SiC in nitrogen containing ambients such as nitrous oxide at high temperatures. The surface state density of SiC can also be lowered by growth of layers of lanthanum-doped oxide, barium doped oxides, or strontium doped oxides. Methods to grow passivation layers on the exposed surface SiC include but are not limited to dry thermal oxidation, wet thermal oxidation, combination of dry and wet thermal oxidation, atomic layer deposition, molecular vapor deposition, chemical vapor deposition, and glow discharge.

The suspended material structure and the anchor material structure material may include but not be limited to bulk hexagonal single-crystal SiC, a stacked layer of bulk hexagonal single crystal SiC and epitaxial hexagonal single-crystal SiC or epitaxial hexagonal single-crystal SiC.

The suspended material structure beam can be widely applied to a variety of sensors. For example, a variable capacitor may be simply formed by adjusting the distance between two adjacent suspended beams. In such way, the MEMS sensor (e.g. an accelerometer) will be further fabricated. The suspended material structure may be comprise a suspended hexagonal-SiC material layer structure that is single-clamped or double-clamped to SiC material layer structure(s) that is (are) connected to an anchor.

A technique decouples a microelectromechanical system (MEMS) device from sources of strain by forming a MEMS structure with suspended electrodes that are mechanically anchored in a manner that reduces or eliminates transfer of strain from the substrate into the structure, or transfers strain to electrodes and body so that a transducer is strain-tolerant. The technique includes using an electrically insulating material embedded in a conductive structural material for mechanical coupling and electrical isolation.

Hexagonal single-crystal material has a high modulus. SiC material offers the potential of being extremely radiation hard due to the large displacement energy for atom displacement of 21.8 eV. The number of atomic displacements created by an energetic ion, according to the Kinchin-Pease formula, is inversely proportional to the displacement energies.

Wafer Bonding

Bonding approaches for bonding the SiC material that will form the anchor material structures to the substrate include but are not limited to direct wafer bonding, fusion bonding, laminating, anodic bonding, polymer bonding, metal to metal bonding, metallic-alloy bonding, metallic liquid phase bonding, or glass-frit bonding. It is desirable that the bonding be performed at the wafer level for economic consideration but could be performed at the die level.

Direct wafer bonding can be used if the surface roughness of the two surfaces to be bonded is less than about 0.5 nm RMS. Plasma activated (or plasma assisted) wafer surfaces to be bonded can be used to improve the direct wafer bonding process. One advantage of plasma activated wafer bonding is that high mechanical strength wafer bonds can be formed at low temperature and that hydrogen is removed from the wafer surface. The removal of hydrogen in the plasma activated process allows the direct wafer bond a single-crystal SiC wafer surface to a second single-crystal SiC wafer surface without an interface material layer. The direct wafer bond of a SiC surface to a SiC will have high mechanical strength, have high thermal conductivity across the bond interface, and allow high processing temperature such as 1500° C. in some embodiments or 1800° C. in other embodiments. Both hydrophilic and hydrophobic surfaces can be direct wafer bonded; however, hydrophilic has less issues such as hydrogen bubble formation that is common for hydrophobic wafer bonding. The wafer bonding can be performed at room temperature or at elevated temperatures. An anneal in the range of about 400° C. to 1200° C. can increase the wafer bond strength. It can be desirable to have a silicon oxide layer on the surface of the SiC material layers prior to direct wafer bonding. The silicon oxide layer can absorb hydrogen that on the material surfaces and reduce the incidence of hydrogen bubble formation at the wafer bond interface during wafer bonding. In some embodiments, a silicon oxide thickness of more than about 10 nm can be desirable to absorb the hydrogen. In some embodiments, a silicon oxide thickness of more than about 40 nm can be desirable to absorb the hydrogen. Thicker silicon oxide layers can also be used for absorbing the hydrogen and lateral etching for an undercut approach. It is desirable that the silicon oxide be grown by a thermal oxidation process to minimize hydrogen in the silicon oxide layer. It can be desirable to anneal silicon oxide that is grown by Plasma Assisted Chemical Vapor Deposition (PECVD) or Chemical Vapor Deposition (CVD) at temperatures of about 1000° C. to minimize the hydrogen in the silicon oxide layers. An advantage of an LPCVD silicon nitride material layer is that the material will have low hydrogen content. PECVD silicon nitride has a high hydrogen content and it is desirable to anneal to remove the hydrogen prior to direct wafer bonding. It is often desirable to chemical mechanical polish the surface of CVD, PECVD, or LPCVD surface to reduce the surface roughness less than 0.5 nm RMS to facilitate direct wafer bonding. Non-vacuum bonding, moderate vacuum bonding ($1\times10^{-6}$ torr) or ultra high vacuum (UHV) vacuum bonding (about $1\times10^{-9}$ torr) bonding can be used. A significant advantage of vacuum bonding is that vacuum bonding enables a direct wafer bond of SiC material to SiC material. One advantage of a SiC-to-SiC wafer is that extremely high temperature processes are enabled with a SiC-to-SiC wafer bond. For example, oxidation temperature of 1100° C. or higher, or dopant anneal temperatures of 1500° C. or higher, or dopant anneal temperatures of 1800° C. or higher are enabled by a SiC-to-SiC wafer bond. Silicon oxide interface material(s) permit a maximum process temperature of about 1350° C. to 1450° C. after the direct wafer bond. Silicon nitride interface materials permit a maximum process temperature of about 1500° C. to 1600° C. after the direct wafer bond.

Anodic bonding can include SiC to glass bonding in which glass has ionic conductivity to enable anodic bonding. Examples of glass material with sufficient ionic conductivity include Corning 7740 Pyrex glass and Borofloat glasses. Anodic bonding can be performed on surfaces surface roughness greater than 1 nm RMS. Direct wafer bonding typically requires surface roughness less than about 0.5 nm RMS.

Metal-to-metal bonding can include, but is not limited to, gold-to-gold or copper-to-copper thermal compression bonding. The thermal compression bonding is performed at a temperature of about 300 C. It is preferable that the metal-metal bonding be performed at the wafer level but could be performed at the die level.

A combination of anodic bonding and metal-to-metal bonding in laterally separated regions can be used to enable an electrical connection from the SiC material forming the anchor material structure and electrodes formed on the substrate.

Polymer bonding is low cost but can have increased damping.

Electrostatic Sense Electrode

It is desirable that the parasitic capacitance of the electrostatic sense electrode material structure to the first substrate be minimized to reduce the noise at the input to an amplifier that is connected to the sense electrode material structure. The noise at the input to the amplifier is proportional to the capacitance on the electrostatic sense electrode material structure. Thus, it is desirable that the electrostatic sense electrode material structure capacitance be minimized. The interface material thickness and dielectric constant can be selected to minimize sense electrode capacitance to the first substrate. The interface material may be an insulator or high-resistivity material with a resistivity greater than $1 \times 10^5$ ohm-cm. The interface material may include but not be limited to silicon oxide or silicon nitride. The first substrate is semi-insulating or insulating and thus there will not contribute capacitance to the electrostatic sense electrode.

Capacitance of the Sense Electrode

It is desirable to reduce the capacitance between the electrostatic sense electrode material structure and the first substrate. In some embodiments, the capacitance of the electrostatic sense electrode is reduced by using a semi insulating SiC first substrate. In some embodiments, the semi-insulating SiC can have a resistivity greater than $10^5$ ohm-cm. In some embodiments, the semi-insulating SiC can have a resistivity greater than $10^7$ ohm-cm. In some embodiments, the semi-insulating SiC can have a resistivity greater than $10^9$ ohm-cm. In some embodiments, the semi-insulating SiC can have a resistivity greater than $10^{10}$ ohm-cm. In some embodiments, the semi-insulating SiC can have a resistivity greater than $10^{11}$ ohm-cm.

In some embodiments, the capacitance of the sense electrode is reduced by using a glass, ceramic, or quartz substrate. In some embodiments, the semi-insulating SiC can have a resistivity greater than $10^5$ ohm-cm. In some embodiments, the glass, ceramic or quartz substrate can have a resistivity greater than $10^7$ ohm-cm. In some embodiments, the glass, ceramic or quartz substrate can have a resistivity greater than $10^9$ ohm-cm. In some embodiments, the glass, ceramic or quartz substrate can have a resistivity greater than $10^{10}$ ohm-cm. In some embodiments, the glass, ceramic or quartz substrate can have a resistivity greater than $10^{11}$ ohm-cm.

Wafer Bonding of a Thin Free-Standing Hexagonal Single-Crystal SiC Material

Thin free-standing hexagonal single-crystal SiC second substrate with a thickness in the range of about 50 microns to about 200 microns can be made by thinning a standard thickness (about 350 microns to about 500 micron) hexagonal single-crystal second substrate.

An advantage of wafer bonding the thin free-standing hexagonal single-crystal substrate to form the anchor material structure and the suspended material structure is that 1) there is no need to perform further thinning after wafer bonding and 2) it is not required to use a low total thickness variation (TTV) substrate.

The process steps to fabricate a MEMS device using the Thin Free-Standing Hexagonal Single Crystal SiC material approach after direct wafer bonding is similar to the MEMS device fabrication approach that uses a direct wafer bonding followed by thinning approach.

Optional Interface Material Layer

The optional interface material layer can have the properties of being electrically insulating, low surface roughness suitable for direct wafer bonding, thermally conductive to minimize the temperature gradients in a microelectromechanical device, lateral undercut to facilitate the fabrication of a movable suspended material structure, or electrical conductive such as a metal to-metal bond that enables electrical contact to the anchor material structures. The interface material layer(s) can include, but not be limited to, silicon oxide, silicon nitride, polysilicon, aluminum nitride, dielectric, gold, copper, metal, polymer, or glass-frit, or combinations thereof. The interface material layer can absorb hydrogen that is advantageous for direct wafer bonding. The interface material layer can have a surface roughness of less than about 0.5 nm RMS that is advantageous for direct wafer bonding (fusion wafer bonding). The surface of the interface material layers can be chemical mechanical polished to reduce the surface roughness to less than about 0.5 nm. The interface material layers can optionally be laterally undercut to enable a movable suspended material structure using processes such as HF vapor etching, anhydrous HF vapor etching, and wet chemical dilute HF etching for the case of silicon oxide interface material layer. The interface material layers can optionally be laterally undercut to enable a movable suspended material structure using processes such as xenon difluoride ($XeF_2$) or wet chemical hydrofluoric nitride chemical etch in the case of polysilicon. The interface material layers can optionally be laterally undercut to enable a movable suspended material structure using a process such as hot phosphoric acid etch in the case of LPCVD silicon nitride.

An optional interface material layer dielectric layer may be deposited on the first surface of the 4H-SiC material layer. The optional dielectric layer may include but not be limited to a polishing material layer, an undercut material layer, and insulating layer, or a high temperature compatible material layer. Examples of optional interface material layers include, but are not limited to, silicon nitride, aluminum nitride, and silicon oxide. The silicon nitride may be deposited for example by Low Stress Low Pressure Chemical Vapor Deposition. The aluminum nitride may be deposited by atomic layer epitaxy, MOCVD, or physical vapor deposition. A CMP polish can be performed on the surface of the polishable material layer to achieve a surface roughness less than about 0.5 nm RMS. The optional polishable material layer may also be a material that can be undercut by etching. For example, silicon nitride can be etched in hot phosphoric and fluorine based plasmas. Aluminum nitride can be etched in basic solutions. Silicon nitride can be etched in hydrofluoric acid and plasma etches. The silicon nitride layer and aluminum nitride material layers are compatible with the highest 4H-SiC epitaxial growth temperatures. The silicon oxide material layers will not be compatible with the highest 4H-SiC epitaxial growth temperatures. The silicon nitride, aluminum nitride and silicon oxide are insulating layers which can be desirable for MEMS, lateral power electronic devices, and microelectronic devices.

Substrate

The substrate may include, but not be limited to, a single-crystal hexagonal SiC substrate, a N-type single-crystal hexagonal SiC substrate, a P-type single-crystal hexagonal SiC substrate, a semi-insulating single-crystal hexagonal SiC substrate, an insulating single-crystal hexagonal SiC substrate, a silicon substrate, a glass substrate, a glass substrate with ionic conductivity appropriate for anodic bonding, a ceramic substrate, a polycrystalline substrate, a hexagonal single crystal SiC substrate having a SiC epitaxial layer having microelectronic circuits formed in the SiC epitaxial layer for control of and processing of data from microelectromechanical systems or silicon substrate having microelectronic circuits for control of and processing of data from microelectromechanical systems. An advantage of a hexagonal SiC substrate with N-type doping is that it is significantly less expensive than a semi-insulating or insulating hexagonal SiC substrate. The substrate may include, but not be limited to, a high temperature compatible substrate, a linear coefficient of thermal expansion matched substrate, high mechanical strength substrate, high thermal conductivity substrate, a matched thermal conductivity substrate, a low total thickness variation (TTV) substrate, a substrate with low total thickness variation (TTV) and also an low thickness uncertainty, a low surface roughness substrate, a semi-insulating substrate, an insulating substrate, an electrically conductive substrate, a substrate with N-type or P-type doping regions in the substrate, a substrate with etched recesses, a substrate with microelectronic devices, a substrates with patterned electrical electrodes on the surface of the substrate, a substrate with patterned electrical electrodes formed in the recesses of the substrate, a low cost substrate, or an optically transparent substrate, and combination therefore. The substrate properties may include, but not be limited to, a single-crystal substrate, a noncrystalline substrate, a semiconductor substrate, a semi-insulating substrate, an insulating substrate, a glass substrate, a ceramic substrate, polycrystalline substrate, or a metal substrate. The substrate may be patterned and etched to form recessed regions in the substrate.

The linear thermal expansion coefficient of the substrate may have a value that is within 10 percent of the thermal expansion coefficient the 4H-SiC material layers in some embodiments, within 20 percent of the 4H-SiC material layers in some embodiments, within 50 percent of the 4H-SiC material layers in some embodiments, and within 100 percent of the 4H-SiC material layers in some embodiments.

Silicon carbide 4H-SiC, 6H-SiC, CVD polycrystalline SiC substrate, diamond, and aluminum nitride substrates substrate have the properties that the substrates have high mechanical strength substrate, high thermal conductivity substrate (>300 W/mK), can be a semi-insulating substrate ($>1\times10^5$ ohm-cm), can be an insulating substrate (vanadium doped SiC $1\times10^{10}$ ohm-cm) (AlN$>1\times10^{10}$ ohm-cm) and an optically transparent substrate to visible, near ultraviolet, near infrared, and infrared wavelengths. Silicon carbide substrates also have the property that the substrate can be electrically conductive substrate. The semi-insulating single-crystal SiC substrate types may include, but not be limited to, vanadium doped semi-insulating single-crystal SiC substrate, high purity physical vapor transport (PVT) grown semi-insulating single-crystal SiC substrates, and High Temperature Chemical Vapor Deposited (HTCVD) high purity semi-insulating SiC substrates.

Another aspect of this invention is that the hexagonal single-crystal SiC material that is used to form the suspended material structure can be bonded on a substrate with approximately matched linear coefficient of thermal expansion. An advantage of having a substrate with a linear coefficient of expansion that about matches the linear thermal expansion coefficient of the hexagonal single-crystal SiC material layer is that the matched thermal coefficient of expansion facilitates the wafer bonding of the two material layers. Material layers with different thermal expansion coefficient can debond, crack and have significant wafer bow during from higher temperature processes such as annealing to increase the bond strength or growth of a thermal oxide layer. The 4H-SiC, 6H-SiC and CVD polycrystalline substrate approximately matched the linear thermal coefficient of expansion of the hexagonal signal crystal SiC layer use to form the suspended material structure. Thus, very thick 4H-SiC material layers can be bonded without extensive substrate or wafer bow. For example, the 4H-SiC material layer may be about 40 microns thick in some embodiments, about 100 microns thick in some embodiments, about 200 microns thick in some embodiments, or about 500 microns thick in some embodiments.

Suspended Microelectromechanical Materials Structures

A MEMS device may be configured as a resonator that is used in timing devices. The resonator may have a variety of physical shapes, e.g., beams and plates. The MEMS device may have a portion suspended from the substrate (e.g., a suspended mass, body, or resonator) attached to the substrate by an anchor. The suspended material structure may be a feature such as, but not limited to, a beam, a plate, a cantilever arm, or a tuning fork. In a specific embodiment, a MEMS device includes a resonating feature (e.g., suspended mass) flanked by one or more drive electrodes and one or more sense electrodes.

In some embodiments, the movable suspended material structure(s) comprises hexagonal single-crystal SiC material layer on a silicon oxide layer on a substrate that is laterally undercut to form a movable suspended material structure beam. In some embodiments, the movable suspended material structure(s) comprises hexagonal single-crystal SiC material layer on a substrate with etched recess region to aid in enabling movable suspended material structures. The substrate may have patterned electrical electrodes within the etched recesses.

A recess region can be formed in the in the substrate on the substrate first surface prior to the wafer bonding on the 4H-SiC material layer. The recess region can enable movable hexagonal single-crystal material structures that are formed by plasma etching of trenches vertically entirely through hexagonal single-crystal SiC material layer. An etch protect material layer may be formed within the recess region. A patterned electrical electrode may be formed in the recess region and optionally on the upper first surface of the substrate.

Thinning of Hexagonal Single-Crystal SiC Material Layer

After wafer bonding of the hexagonal single-crystal material layer (optional with an interface material layer) to the substrate (with optional interface material layer), the hexagonal single crystal SiC material that is used to form the suspended material structure can be thinned to a selected thickness by a combination of grinding, CMP polishing, and/or RIE etching. The selected thickness of the hexagonal single-crystal material used to form the suspended material structure can be for example 1 micron thick, 2 micron thick, 4 micron thick, 10 micron thick, 20 micron thick, 40 micron thick, 100 micron thick, 200 thick, or 500 micron thick. One approach to reduce the residual stress and subsurface damage at the first surface of the suspended material structure of the thinning operation is to use a stress release chemical mechanical polish (CMP) and/or a plasma etch process. The thinning approach can include a combination of grinding, polishing, and chemical mechanical polishing. The chemical polishing procedure is important to reduce the stress and subsurface damage at the grinding and polish surface of single-crystal SiC second substrate.

Deep Trench SiC Etching

In some MEMS devices, the actuation or sensing can be by electrostatic coupling. The electrostatic coupling between the suspended material structure and the anchor material structure is dependent on the width of the trench etched region and the sidewall angle of the trench region. The sidewall angle of the deep trench can be in the range of about 3 degrees to 15 degrees off of the vertical axis. The aspect ratio of the deep trench can be in the range of greater than 5 to 1 to greater than 100 to 1. The width of the trench can be as small as about 0.5 microns or as large as about 5 to 8 microns. The width of the deep trench can be about 1 micron for a suspended material structure that is less than about 10 microns thick. The width of the deep trench can be about 2 micron for a suspended material structure that is less than about 20 microns thick. The width of the deep trench can be about 3 microns for a suspended material structure that is less than about 40 microns thick. The width of the deep trench can be about 4 micron for a suspended material structure that is less than about 60 microns thick. The deep trench etch entirely through the thickness of the N-type hexagonal single-crystal layer can be performed by ICP-RIE SiC etching using gases such SF6 plus argon, oxygen, or other gases to form movable suspended material structures above the recesses.

Electrostatic coupling to a 4H-SiC beam typically requires that the beam have an electrical conductivity and thus it is typically preferred that the 4H-SiC material be doped N-type with a doping concentration in the range of $5 \times 10^{18}$ cm$^{-3}$ to $1 \times 10^{19}$ cm$^{-3}$. Commercial 4H-SiC SiC substrates can be N-type. 4H-SiC epitaxial layers can be grown to be N-type to selected doping in the range of $1 \times 10^{14}$ cm$^{-3}$ to about $1 \times 10^{20}$ cm$^{-3}$.

A hexagonal single-crystal SiC suspended material structure and anchor material structure can have a first surface (top surface) that is a carbon face and a second surface (bottom surface) that is silicon face. A hexagonal single-crystal SiC suspended material structure and anchor material structure can have a first surface (top surface) that is a silicon face and a second surface (bottom surface) that is carbon face.

Example Device Embodiment 2

In another embodiment, this invention provides one or more than one suspended material structure(s) that comprise hexagonal single-crystal SiC material having a first surface and a second surface with each suspended material structure attached (fixed) to one or more than one anchor material structures that are bonded to a first substrate with no interface material layer, one optional interface material layer or more than one optional interface material layers at the interface between the hexagonal single-crystal SiC material layer and the first substrate. The anchor material structure comprise hexagonal single-crystal hexagonal SiC material. The anchor material structure and the suspended material structure may be formed from a single-crystal hexagonal SiC material and the anchor material structure is bonded (attached) to the first substrate and the suspended material structure is not attached to the first substrate. The substrate may be a single crystal SiC substrate.

The first substrate may have an etched recess region on the substrate first surface to facilitate the formation of the movable suspended material structures. The substrate may have patterned electrical electrodes on the substrate first surface, within recesses etched into the first substrate, and within recesses etched into the substrate and on the substrate first surface. The electrical electrode contact can be formed on the second surface (bottom side) of the hexagonal single-crystal material structure anchor material structure.

Figure 9:
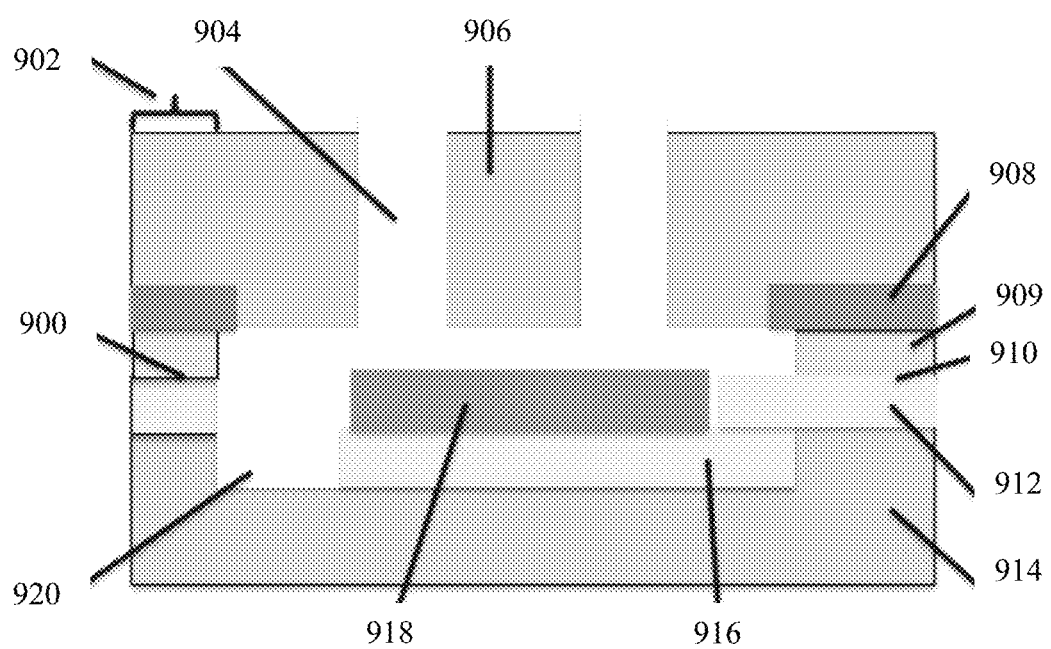
FIG. 9 is a schematic of hexagonal single-crystal SiC on optional interface material layer(s) on a hexagonal single-crystal substrate with trenches etched in hexagonal single-crystal SiC suspended material structure and an RIE etch stop protect layer and electrical electrode that makes electrical contact to the anchor material region.

FIG. 9 shows a hexagonal single-crystal SiC on optional interface material layer(s) on a hexagonal single-crystal first substrate with trenches etched through the hexagonal single-crystal SiC suspended material structure and an RIE etch stop protect layer and electrical electrode that makes electrical contact to the anchor material region. The structure comprises an electrical conductive bond contact (optionally metal to metal bond) 900, an anchor material structure region 902, trench etched regions 904, movable suspended hexagonal single-crystal SiC material structures 906 (beams, membranes, cantilevers, or bridges) with one or more than one attachments to anchor structure material for MEMS applications, an optional doped region in SiC to reduce ohmic contact resistance 908, an electrical electrode contact 909, an electrical conductive bond contact (optionally metal to metal bond contact) 910, an electrical electrode 912, a hexagonal single-crystal SiC substrate (optionally semi-insulating) 914, an electrical electrode 916, an RIE etch protect layer (optionally electrical electrode) 918, and recess regions 920.

Figure 10:
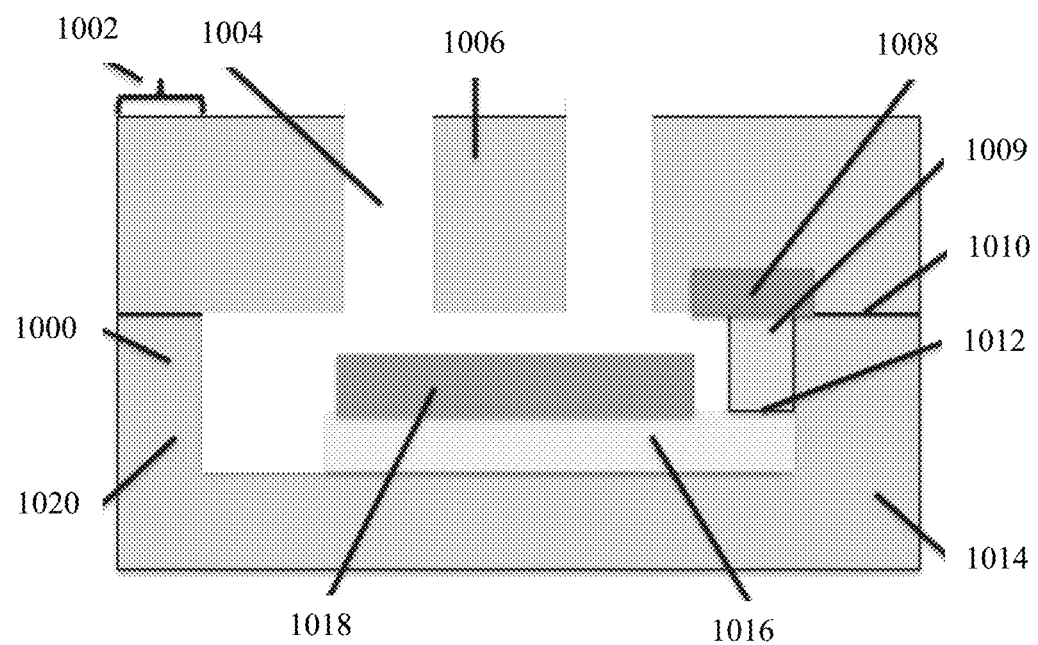
FIG. 10 is a schematic of hexagonal single-crystal SiC anodically bonded to a glass substrate and simultaneously metal-to-metal bond in a laterally separated region with an RIE etch stop protect layer and electrical electrode that makes electrical contact to the anchor material region.

FIG. 10 shows hexagonal single-crystal SiC anodically bonded to a glass substrate and simultaneously metal-to-metal bond in a laterally separated region with an RIE etch stop protect layer and electrical electrode that makes electrical contact to the anchor material region. The structure comprises an electrical conductive bond contact (optionally metal to metal bond) 1000, an anchor material structure region 1002, trench etched regions 1004, movable suspended hexagonal single-crystal SiC material structures 1006 (beams, membranes, cantilevers, or bridges) with one or more than one attachments to anchor structure material for MEMS applications, an optional doped region in SiC to reduce ohmic contact resistance 1008, an electrical electrode contact to SiC 1009, an anodic bond interface 1010, a metal to metal bond 1012, semi-insulating or insulating hexagonal SiC substrate or glass substrate with ionic conduction for anodic bonding such as Pyrex 7740 or borofloat 1014, an electrical electrode 1016, an RIE etch protect layer (optionally electrical electrode) 1018, and recess regions 1020.

Figure 11:
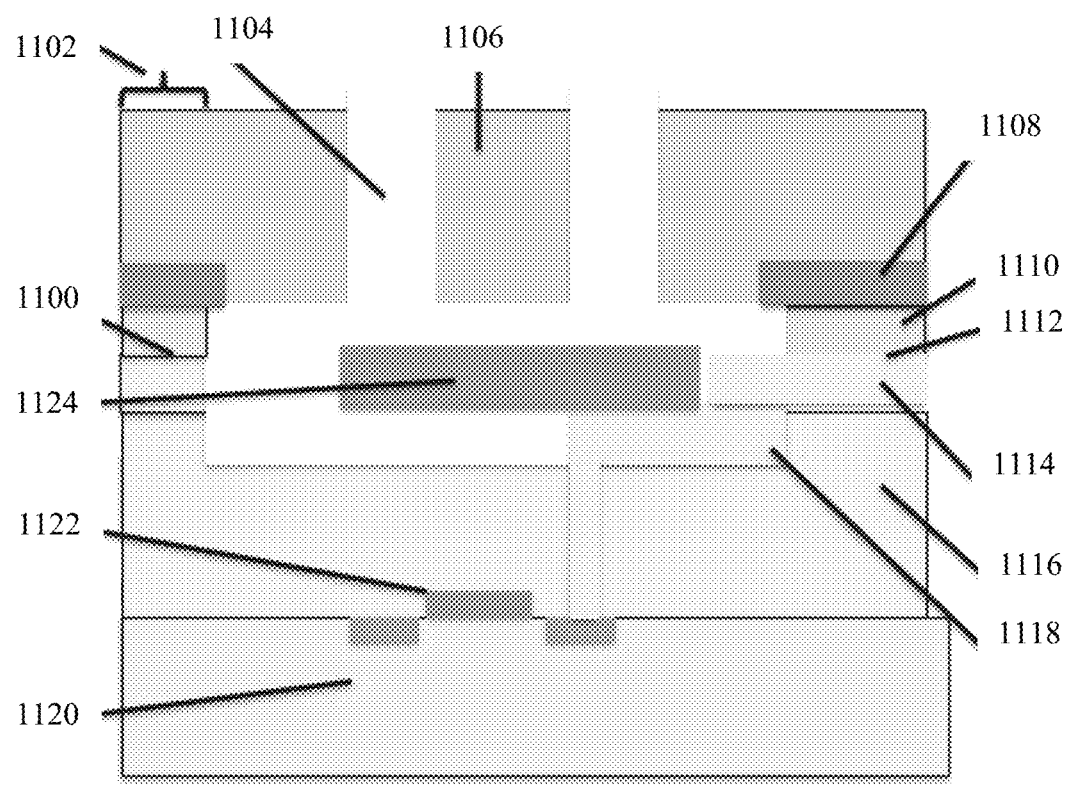
FIG. 11 is a schematic of hexagonal single-crystal SiC with anchor material regions electrically attached to a silicon substrate or a SiC substrate with epitaxial layer having microelectronic devices such as MOSFET for the control of and processing data from a microelectromechanical systems MEMS.

FIG. 11 shows a hexagonal single-crystal SiC with anchor material regions electrically attached to a silicon substrate or a SiC substrate with epitaxial layer having microelectronic devices such as MOSFET for the control of and processing data from a MEMS. The structure comprises an electrical conductive bond contact (optionally metal to metal bond) 1100, an anchor material structure region 1102, trench etched regions 1104, movable suspended hexagonal single-crystal SiC material structures 1106 (beams, membranes, cantilevers, or bridges) with one or more than one attachments to anchor structure material for MEMS applications, an optional doped region in SiC to reduce ohmic contact resistance 1108, an electrical electrode contact to SiC 1110, an electrical conductive bond contact (optionally metal to metal bond contact) 1112, an electrical electrode 1114, a hexagonal single-crystal SiC substrate (optionally semi-insulating) 1116, an electrical electrode 1118, an SiC epitaxial layer on SiC substrate or silicon substrate 1120, microelectronic circuitry for control of and processing data from a MEMS structure 1122, and an RIE etch protect layer (optionally electrical electrode) 1124.

Figure 12:
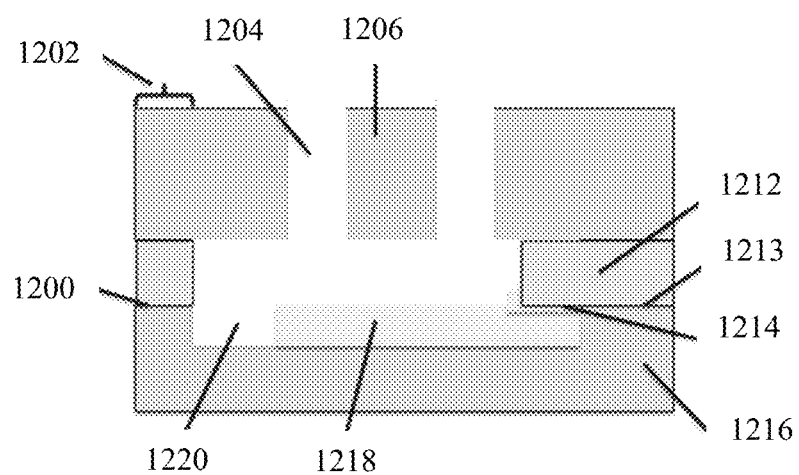
FIG. 12 is a schematic of hexagonal single-crystal SiC on optional interface material layer(s) on a hexagonal single-crystal substrate with trenches etched in hexagonal single-crystal SiC suspended material structure with the use of electrically conductive doped polycrystalline silicon surface to facilitate anodic bonding to a glass substrate.

FIG. 12 shows a hexagonal single-crystal SiC on optional interface material layer(s) on a hexagonal single-crystal substrate with trenches etched in hexagonal single-crystal SiC suspended material structure with the use of electrically conductive doped polycrystalline silicon surface to facilitate anodic bonding to a glass. The structure comprises an anodic bond interface 1200, an anchor material structure region 1202, trench etched regions 1204, movable suspended hexagonal single-crystal SiC material structures 1206 (beams, membranes, cantilevers, or bridges) with one or more than one attachments to anchor structure material for MEMS applications, an electrically conductive doped polysilicon 1212, an anodic bond interface 1213, An electrically conductive contact of metal to electrically conductive doped polysilicon 1214, a glass substrate with ionic conduction for anodic bonding such as Pyrex 7740 or borofloat 1216, an electrical electrode and optional RIE etch protect 1218, and recess regions 1220.

Figure 13:
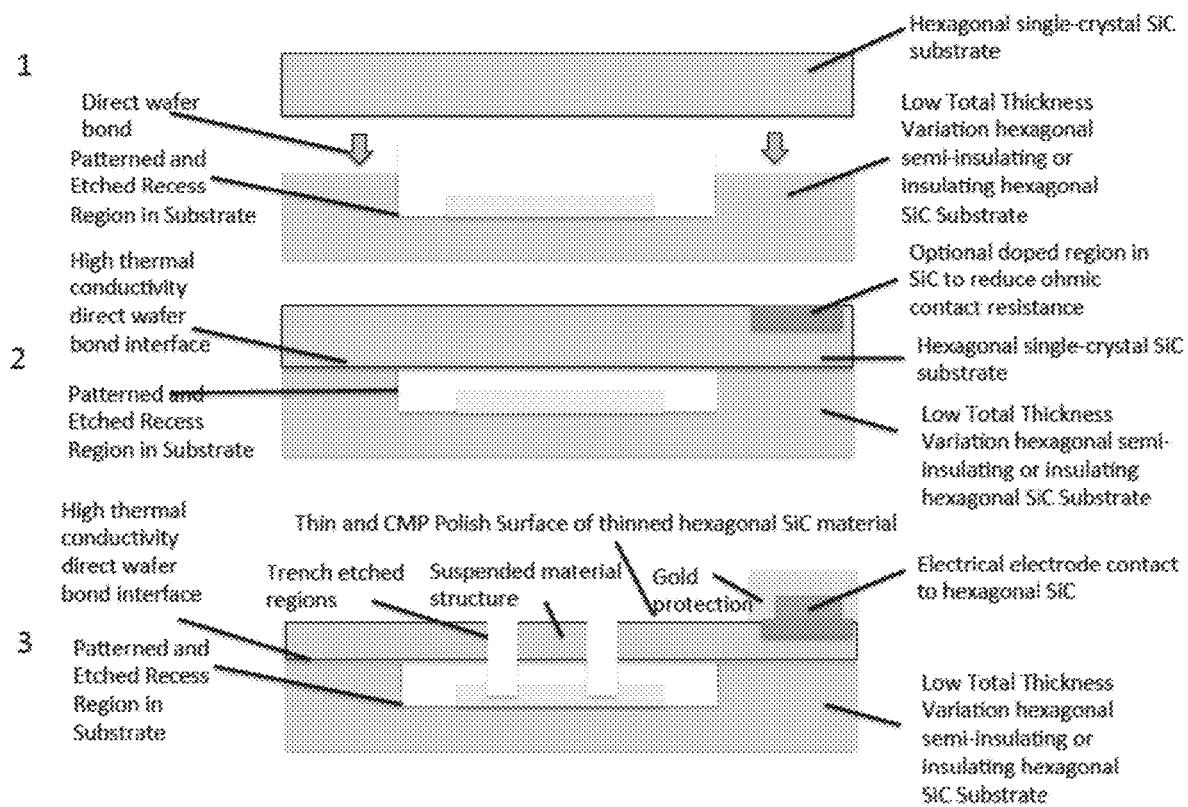
FIG. 13 is a schematic of an example method to wafer bond hexagonal single-crystal material to a substrate with optional etched recess region and optional material layer.

Example Method 1: Metal electrode contact to the first surface of the anchor material structure (FIG. 13).

1. 6H-SiC or 4H-SiC semi-insulating single-crystal first substrate.
2. Thin and polish the 6H-SiC or 4H-SiC semi-insulating single-crystal first substrate to a low total thickness variation (TTV) and to a selected thickness.
3. Photolithography step 1: Photodefine region for etching alignment marks in the semi insulating single-crystal first substrate
4. RIE etch alignment marks about 0.1-0.3 microns deep into the hexagonal semi-insulating single-crystal SiC first substrate and strip etch-mask
5. Photolithography step 2: Photodefine region for etching a recess in the first surface of the semi-insulating single-crystal first substrate.
6. RIE etch a recess about three microns deep into the first surface of the hexagonal semi insulating single-crystal first substrate and strip etch-mask.
7. Optionally-grow about 40 nm thermal oxide interface material layer on first surface and recess surface of the semi-insulating single-crystal first substrate.
8. Optionally grow about 40 nm thick thermal oxide on N-type 6H-SiC or N-type 4H-SiC single-crystal second substrate.
9. Photolithography step 3: Photodefine RIE etch protect material layer. The RIE etch protect layer is a material layer that has a slow etch rate in the SiC RIE etch gases. The RIE etch protect layer may include but not be limited to nickel metal layer, aluminum metal layer, indium tin oxide material layer, and an aluminum nitride material layer. The RIE etch protect layer can be an electrical electrode.
10. Optionally deposit polysilicon with thickness greater than the recess depth and polish flat with low surface roughness less than 0.5 nm rms.
11. Direct wafer bond the first surface of the hexagonal semi-insulating single-crystal SiC surface to the N-type doped hexagonal single-crystal material. The surface of the optional silicon oxide interface material layers may be activated prior to wafer bonding by plasma activation and/or chemical activation. The direct wafer bonding process may be a non-vacuum direct wafer bond process, a vacuum direct wafer bonding process, or a UHV vacuum direct wafer bonding process.
12. Anneal at 400° C. to 1100° C. to increase the bond strength of the direct wafer bonded region.
13. Thin the N-type doped hexagonal single-crystal material to 2 to 200 micron final thickness and perform a CMP polish for stress reduction and removal of sub-surface damage.
14. Photolithography step 4: Photodefine region for etching top-side alignment marks in the N type doped hexagonal single-crystal material.
15. RIE etch alignment marks about 0.1-0.3 microns deep into the N-type doped hexagonal single-crystal material and strip etch-mask.
16. Optional Photolithography step to define region for an N-type dopant (for example nitrogen ion) ion implantation into a patterned region of the N-type doped hexagonal single-crystal material.
17. Optional anneal at about 1500° C. or about 1600° C. to activate the N-type nitrogen ion implantation dopant.
18. Photolithography step 5: Photodefine a metal layer that makes ohmic contact to N-type hexagonal single-crystal SiC first surface. A thin titanium layer (about 10 nm) and a nickel layer about 100 nm thick can be used to make an ohmic contact to the first surface of the N type hexagonal single-crystal SiC material layer after heat-treatment.
19. Photolithography step 6: Photodefine a gold layer 300 nm or thicker that can facilitate the wire bonding to the metal on the first surface of the N-type hexagonal single-crystal SiC material layer.
20. Photolithography step 7: Photodefine a protect layer material layer that protects the metal for the ohmic contact to the first surface of the N-type hexagonal single-crystal SiC material layer. The protect layer material may be gold or another material resistant to the chemicals used in subsequent steps.
21. Photolithography step 8: Photodefine a material layer that performs as a RIE etch definition layer for the SiC trench etch on the first surface of the N-type hexagonal single-crystal SiC. The RIE etch definition masking layer that defines where SiC will be etched can be a nickel layer, an aluminum layer, an aluminum nitride layer, or an indium thin oxide layer, or combinations thereof. The nickel layer can be formed by electroplating nickel inside of a photodefined resist mode or deposition of nickel and a resist or dielectric masking layer followed by a subtractive etch using ion beam milling or plasma etching. Nickel can also be etched by chemical etching. The aluminum layer can be subtractive etched by RIE plasma etch.

22. Perform the ICP-RIE SiC trench etch entirely through the thickness of the N-type hexagonal single-crystal layer using gases such SF6 plus argon, oxygen, or other gases to form movable suspended material structures above the recesses.
23. Remove the nickel masking layer and then perform critical point drying to prevent striction.
24. Shadow mask deposit gold wire-bond pads for contact to recess metal.
25. Separate, die-bond, and wire-bond to MEMS die.

Figure 14:
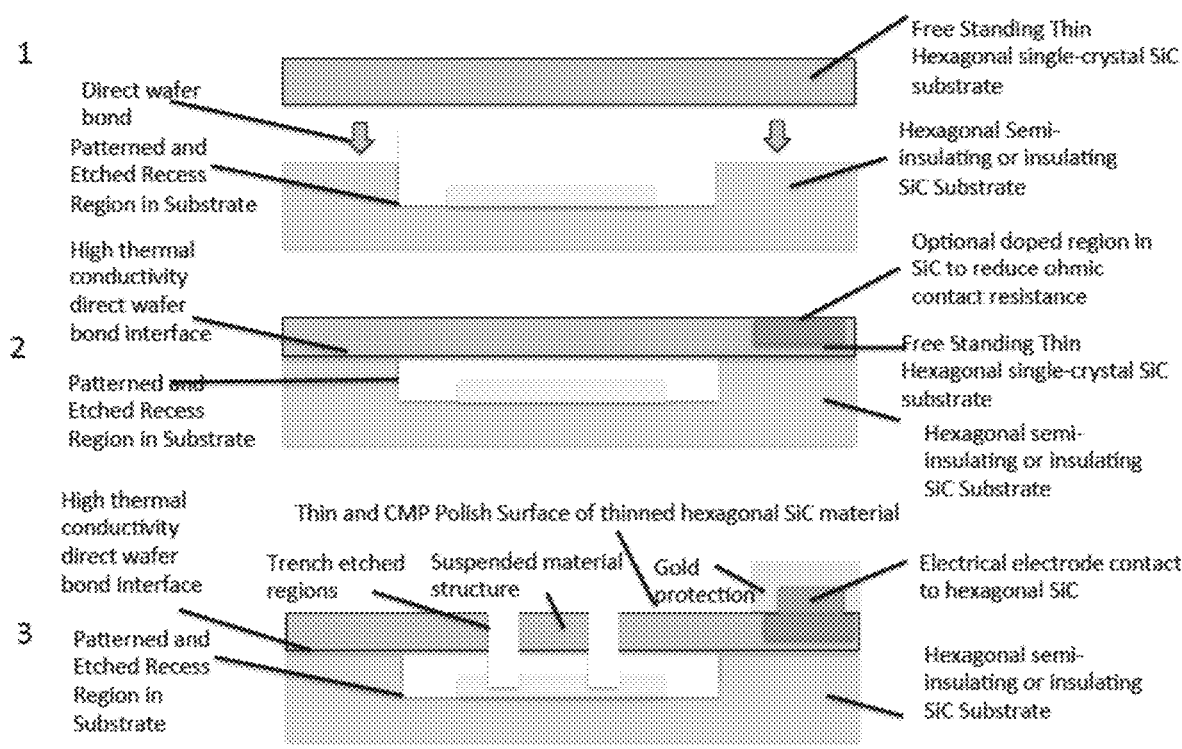
FIG. 14 is a schematic of an example method to wafer bond hexagonal single-crystal material to a substrate with optional etched recess region and optional material layer.

Example Method 2: Use of free-standing thin hexagonal single-crystal SiC substrate for anchor material structure and suspended material structure (Metal electrode contact to the first surface of the anchor material structure) (FIG. 14).

1. 6H-SiC or 4H-SiC semi-insulating single-crystal first substrate.
2. Thin and polish the 6H-SiC or 4H SiC semi-insulating single-crystal first substrate to a low total thickness variation (TTV) and to a selected thickness.
3. Photolithography step 1: Photodefine region for etching alignment marks in the semi insulating single-crystal first substrate.
4. RIE etch alignment marks about 0.1-0.3 microns deep into the hexagonal semi-insulating single-crystal SiC first substrate and strip etch-mask.
5. Photolithography step 2: Photodefine region for etching a recess in the first surface of the semi-insulating single-crystal first substrate.
6. RIE etch a recess about three microns deep into the first surface of the hexagonal semi insulating single-crystal first substrate and strip etch-mask.
7. Optionally-grow about 40 nm thermal oxide interface material layer on first surface and recess surface of the semi-insulating single-crystal first substrate.
8. Optionally grow about 40 nm thick thermal oxide on N-type 6H-SiC or N-type 4H-SiC single-crystal second substrate.
9. Photolithography step 3: Photodefine RIE etch protect material layer. The RIE etch protect layer is a material layer that has a slow etch rate in the SiC RIE etch gases. The RIE etch protect layer may include but not be limited to nickel metal layer, aluminum metal layer, indium tin oxide material layer, and an aluminum nitride material layer. The RIE etch protect layer can be an electrical electrode.
10. Optionally deposit polysilicon with thickness greater than the recess depth and polish flat with low surface roughness less than 0.5 nm rms.
11. Direct wafer bond the first surface of the hexagonal semi-insulating single-crystal SiC surface to the thin free-standing N-type doped hexagonal single-crystal material. The surface of the optional silicon oxide interface material layers may be activated prior to wafer bonding by plasma activation and/or chemical activation. The direct wafer bonding process may be a non-vacuum direct wafer bond process, vacuum direct wafer bonding process, or a UHV vacuum direct wafer bonding process.
12. Anneal at 100° C. to 1100° C. to increase the bond strength of the direct wafer bonded region.
13. Photolithography step 4: Photodefine region for etching top-side alignment marks in the N type doped hexagonal single-crystal material.
14. RIE etch alignment marks about 0.1-0.3 microns deep into the N-type doped hexagonal single-crystal material and strip etch-mask.
15. Optional Photolithography step to define region for an N-type dopant (for example nitrogen ion) ion implantation into a patterned region of the N-type doped hexagonal single-crystal material.
16. Optional anneal at about 1500° C. or about 1600° C. to active the N-type nitrogen ion implantation dopant.
17. Photolithography step 5: Photodefine a metal layer that makes ohmic contact to N-type hexagonal single-crystal SiC first surface. A thin titanium layer (about 10 nm) and a nickel layer about 100 nm thick can be used to make an ohmic contact to the first surface of the N type hexagonal single-crystal SiC material layer after heat-treatment.
18. Photolithography step 6: Photodefine a gold layer 300 nm or thicker that can facilitate the wire bonding to the metal on the first surface of the N-type hexagonal single-crystal SiC material layer.
19. Photolithography step 7: Photodefine a protect layer material layer that protects the metal for the ohmic contact to the first surface of the N-type hexagonal single-crystal SiC material layer. The protect layer material layer may be gold or another material resistant to the chemicals used in subsequent steps.
20. Photolithography step 8: Photodefine a material layer that performs as a RIE etch definition layer for the SiC trench etch on the first surface of the N-type hexagonal single-crystal SiC. The RIE etch definition layer that defines where SiC will be etched can be a nickel layer, an aluminum nitride layer, or an indium thin oxide layer or combinations thereof.
21. Perform the ICP-RIE SiC trench etch entirely through the thickness of the N-type hexagonal single-crystal layer using gases such SF6 plus argon, oxygen, or other gases to form movable suspended material structures above the recesses.
22. Remove the nickel masking layer and then perform critical point drying to prevent striction.
23. Shadow mask deposit gold wire-bond pads for contact to recess metal.
24. Separate, die-bond, and wire-bond to MEMS die.

Example Method 3: Use of epitaxial hexagonal single-crystal SiC material for anchor material structure and suspended material structure (Metal electrode contact to the first surface of the anchor material structure).

1. 6H-SiC or 4H-SiC semi-insulating single-crystal first substrate.
2. Thin and polish the 6H-SiC or 4H SiC semi-insulating single-crystal first substrate to a low total thickness variation (TTV) and to a selected thickness.
3. Photolithography step 1: Photodefine region for etching alignment marks in the semi insulating single-crystal first substrate.
4. RIE etch alignment marks about 0.1-0.3 microns deep into the hexagonal semi-insulating single-crystal SiC first substrate and strip etch-mask.
5. Photolithography step 2: Photodefine region for etching a recess in the first surface of the semi-insulating single-crystal first substrate.
6. RIE etch a recess about three microns deep into the first surface of the hexagonal semi insulating single-crystal first substrate and strip etch-mask.
7. Optionally-grow about 40 nm thermal oxide interface material layer on first surface and recess surface of the semi-insulating single-crystal first substrate.
8. Grow an N-type SiC epitaxial layer on the surface of the N-type 6H-SiC or N-type 4H SiC single-crystal second substrate. The N-type SiC epitaxial layer can have a thickness of about 4 microns to about 200 microns.

9. Perform a CMP polish of the surface of the epitaxial layer to achieve a surface roughness less than 0.5 nm RMS.
10. Optionally grow about 40 nm thick thermal oxide on N-type 6H-SiC or N-type 4H-SiC single-crystal second substrate.
11. Photolithography step 3: Photodefine RIE etch protect material layer. The RIE etch protect layer is a material layer that has a slow etch rate in the SiC RIE etch gases. The RIE etch protect layer may include but not be limited to nickel metal layer, aluminum metal layer, indium tin oxide material layer, and an aluminum nitride material layer. The RIE etch protect layer can be an electrical electrode.
12. Optionally deposit polysilicon with thickness greater than the recess depth and polish flat with low surface roughness less than 0.5 nm rms
13. Direct wafer bond the first surface of the hexagonal semi-insulating single-crystal SiC surface to the N-type doped hexagonal single-crystal material. The surface of the optional silicon oxide interface material layers may be activated prior to wafer bonding by plasma activation and/or chemical activation. The direct wafer bonding process may be a non-vacuum direct wafer bond process, a vacuum direct wafer bonding process, or a UHV vacuum direct wafer bonding process.
14. Anneal at 400° C. to 1100° C. to increase the bond strength of the direct wafer bonded region.
15. Thin the N-type doped bulk hexagonal single-crystal material with the N-type epitaxial layer to within about 5 μm from the interface of the N-type doped hexagonal single crystal material and the semi-insulating SiC substrate leaving about 5 μm of N-type doped bulk hexagonal single-crystal SiC on the exposed surface to facilitate making ohmic contact to the N-type material. Perform a CMP polish for stress reduction and removal of subsurface damage.
16. Optional Photolithography step to define region for an N-type dopant (for example nitrogen ion) ion implantation into a patterned region of the N-type doped hexagonal single-crystal material.
17. Optional anneal at about 1500° C. or about 1600° C. to active the N-type nitrogen ion implantation dopant.
18. Photolithography step 4: Photodefine region for etching top-side alignment marks in the N type doped hexagonal single-crystal material.
19. RIE etch alignment marks about 0.1-0.3 microns deep into the N-type doped hexagonal single-crystal material and strip etch-mask.
20. Photolithography step 5: Photodefine a metal layer that makes ohmic contact to N-type hexagonal single-crystal SiC first surface. A thin titanium layer (about 10 nm) and a nickel layer about 100 nm thick can be used to make an ohmic contact to the first surface of the N type hexagonal single-crystal SiC material layer after heat-treatment.
21. Photolithography step 6: Photodefine a gold layer 300 nm or thicker that can facilitate the wire bonding to the metal on the first surface of the N-type hexagonal single-crystal SiC material layer.
22. Photolithography step 7: Photodefine a protect layer material layer that protects the metal for the ohmic contact to the first surface of the N-type hexagonal single-crystal SiC material layer. The protect layer material may be gold or another material resistant to the chemicals used in subsequent steps.
23. Photolithography step 8: Photodefine a material layer that performs as a RIE etch definition layer for the SiC trench etch on the first surface of the N-type hexagonal single-crystal SiC. The RIE etch definition layer that defines where SiC will be etched can be a nickel layer, an aluminum nitride layer, or an indium thin oxide layer or combinations thereof.
24. Perform the ICP-RIE SiC trench etch entirely through the thickness of the N-type hexagonal single-crystal layer using gases such SF6 plus argon, oxygen, or other gases to form movable suspended material structures above the recesses.
25. Remove the nickel masking layer and then perform critical point drying to prevent striction.
26. Shadow mask deposit gold wire-bond pads for contact to recess metal.
27. Separate, die-bond, and wire-bond to MEMS die.

Example Method 4: Metal electrode contact to the second surface of the anchor material structure with metal-to-metal bond.

1. 6H-SiC or 4H-SiC semi-insulating single-crystal first substrate.
2. Thin and polish the 6H-SiC or 4H-SiC semi-insulating single-crystal first substrate to a low total thickness variation (TTV) and to a selected thickness.
3. Photolithography step 1: Photodefine region for etching alignment marks in the semi insulating single-crystal first substrate.
4. RIE etch alignment marks about 0.1-0.3 microns deep into the hexagonal semi-insulating single-crystal SiC first substrate and strip etch-mask.
5. Photolithography step 2: Photodefine region for etching a recess in the first surface of the semi-insulating single-crystal first substrate.
6. RIE etch a recess about three microns deep into the first surface of the hexagonal semi insulating single-crystal first substrate and strip etch-mask.
7. Photolithography step 3: Photodefine RIE etch protect material layer. The RIE etch protect layer is a material layer that has a slow etch rate in the SiC RIE etch gases. The RIE etch protect layer may include but not be limited to nickel metal layer, aluminum metal layer, indium tin oxide material layer, and an aluminum nitride material layer. The RIE etch protect layer can be an electrical electrode. Alternately, the RIE etch protect material layer can protect a gold or copper electrical electrode that are appropriate for metal-to-metal thermal compression bonding as shown in FIG. 9. Photodefine gold or copper metal electrode so that the metal electrode extends from the bottom of the recess region over the side of the recess region to the upper first surface of the substrate.
8. Photolithography step 4: Photodefine a metal layer that makes ohmic contact to the second surface of the N-type hexagonal single-crystal SiC. A thin titanium layer (about 10 nm) and a nickel layer about 100 nm thick can be used to make an ohmic contact to the first surface of the N-type hexagonal single-crystal SiC material layer after heat-treatment.
9. Photolithography step 5. Photodefine a gold or copper layer on the surface of the ohmic contact metal.
10. Perform a gold-to-gold or copper-to-copper thermal compression metal-to-metal bond at approximately 300° C.

11. Thin the N-type doped hexagonal single-crystal material to 2 to 200 micron final thickness using a combination of grinding, polishing and/or CMP polishing. Perform a CMP polish for stress reduction and removal of subsurface damage.
12. Photolithography step 4: Photodefine region for etching top-side alignment marks in the N type doped hexagonal single-crystal material.
13. RIE etch alignment marks about 0.1-0.3 microns deep into the N-type doped hexagonal single-crystal material and strip etch-mask.
14. Optional Photolithography step to define region for an N-type dopant (for example nitrogen ion) ion implantation into a patterned region of the N-type doped hexagonal single-crystal material.
15. Optional anneal at about 1500° C. or about 1600° C. to active the N-type nitrogen ion implantation dopant.
16. Photolithography step 5: Photodefine a metal layer that makes ohmic contact to N-type hexagonal single-crystal SiC first surface. A thin titanium layer (about 10 nm) and a nickel layer about 100 nm thick can be used to make an ohmic contact to the first surface of the N type hexagonal single-crystal SiC material layer after heat-treatment.
17. Photolithography step 6: Photodefine a gold layer 300 nm or thicker that can facilitate the wire bonding to the metal on the first surface of the N-type hexagonal single-crystal SiC material layer.
18. Photolithography step 7: Photodefine a protect layer material layer that protects the metal for the ohmic contact to the first surface of the N-type hexagonal single-crystal SiC material layer. The protect layer material may be gold or another material resistant to the chemicals used in subsequent steps.
19. Photolithography step 8: Photodefine a material layer that performs as a RIE etch definition layer for the SiC trench etch on the first surface of the N-type hexagonal single-crystal SiC. The RIE etch definition layer that defines where SiC will be etched can be a nickel layer, an aluminum nitride layer, or an indium thin oxide layer or combinations thereof.
20. Perform the ICP-RIE SiC trench etch entirely through the thickness of the N-type hexagonal single-crystal layer using gases such SF6 plus argon, oxygen, or other gases to form movable suspended material structures above the recesses.
21. Remove the nickel masking layer and then perform critical point drying to prevent striction.
22. Shadow mask deposit gold wire-bond pads for contact to recess metal.
23. Separate, die-bond, and wire-bond to MEMS die.

Example Method 5: Metal electrode contact to the second surface of the anchor material structure with simultaneous metal-to-metal bonding and SiC to substrate bonding. Select the depth of the RIE etch recess, the thickness of the electrode metal in the recess, and the thickness of the metal that contacts the second surface of the N-type hexagonal single-crystal SiC material layer to allow simultaneous metal-to-metal bond and direct wafer bond of SiC surface to SiC surface. Alternately, select the depth of the RIE etch recess in glass, the thickness of the electrode metal in the recess, and the thickness of the metal that contacts the second surface of the N-type hexagonal single-crystal SiC material layer to allow simultaneous metal-to-metal bond and direct wafer bond of SiC surface to glass anodic bonding. A stepped region in the RIE etched recess in the SiC substrate or the glass substrate as shown in FIG. 10 can be used to allow simultaneous metal-to-metal bond and anodic bond of the SiC surface to glass substrate (suitable for anodic bonding).

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method of making a silicon carbide microelectromechanical (MEMS) structure, comprising:
   bonding a hexagonal single-crystal SiC material to a substrate, wherein a thickness of the hexagonal single-crystal SiC material is greater than 40 microns and up to 500 microns; and
   etching trenches entirely through the hexagonal single-crystal SiC material to form suspended material structures.
2. The method of claim 1, further comprising etching a recess into a first surface of the substrate before bonding the hexagonal single-crystal SiC material.
3. The method of claim 1, wherein the substrate is semi-insulating.
4. The method of claim 1, wherein the substrate is a 4H or 6H SiC substrate.
5. The method of claim 1, wherein the substrate has patterned electrical electrodes.
6. The method of claim 1, wherein one or more anchor material structures are bonded to the substrate by direct wafer bonding.
7. The method of claim 1, wherein the substrate is a glass substrate.
8. The method of claim 1, wherein one or more anchor material structures are bonded to the substrate by anodic bonding.

* * * * *